US012694943B2

(12) United States Patent
Tian et al.

(10) Patent No.: US 12,694,943 B2
(45) Date of Patent: Jul. 28, 2026

(54) NON-VOLATILE MEMORY WITH LEAK TESTS

(71) Applicant: Sandisk Technologies, Inc., Milpitas, CA (US)

(72) Inventors: Xuan Tian, Shanghai (CN); Liang Li, Shanghai (CN); Deepanshu Dutta, Milpitas, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 279 days.

(21) Appl. No.: 18/393,557

(22) Filed: Dec. 21, 2023

(65) Prior Publication Data

US 2025/0210124 A1     Jun. 26, 2025

(51) Int. Cl.
G11C 29/50 (2006.01)
G06F 11/00 (2006.01)

(52) U.S. Cl.
CPC ...... G11C 29/50004 (2013.01); G06F 11/008 (2013.01)

(58) Field of Classification Search
CPC .................... G11C 29/50004; G06F 11/008
See application file for complete search history.

(56) References Cited

U.S. PATENT DOCUMENTS

| | | | | |
|---|---|---|---|---|
| 9,711,227 | B1 * | 7/2017 | Ghai | ..................... G11C 16/14 |
| 10,565,123 | B2 | 2/2020 | Song | |
| 10,573,397 | B1 | 2/2020 | Sehgal | |
| 10,649,988 | B1 | 5/2020 | Gold | |
| 10,691,537 | B2 | 6/2020 | Sun | |
| 10,922,380 | B2 | 2/2021 | Korthikanti | |
| 11,088,712 | B2 | 8/2021 | Zamir | |
| 11,687,252 | B2 | 6/2023 | Li et al. | |
| 11,790,992 | B2 | 10/2023 | Lien et al. | |
| 2002/0031012 | A1 * | 3/2002 | Chen | .................. G11C 16/3409 365/185.26 |
| 2018/0174658 | A1 | 6/2018 | Kikuchi | |
| 2019/0042937 | A1 | 2/2019 | Sheller | |
| 2019/0108888 | A1 | 4/2019 | Sarkar | |
| 2019/0205729 | A1 | 7/2019 | Tran | |
| 2019/0311267 | A1 | 10/2019 | Qin | |
| 2020/0020393 | A1 | 1/2020 | Al-Shamma | |
| 2020/0134469 | A1 | 4/2020 | Choo et al. | |
| 2020/0311512 | A1 | 10/2020 | Choi | |
| 2020/0321066 | A1 | 10/2020 | Oh | |
| 2020/0342945 | A1 | 10/2020 | Sarkar et al. | |
| 2020/0356718 | A1 | 11/2020 | Chu | |

(Continued)

OTHER PUBLICATIONS

Non-Final Office Action mailed Nov. 24, 2023, U.S. Appl. No. 17/709,745.

(Continued)

*Primary Examiner* — Mark D Featherstone
*Assistant Examiner* — Jeffrey Andrew Yang
(74) *Attorney, Agent, or Firm* — PEARL COHEN ZEDK LATZER BARATZ LLP

(57)     ABSTRACT

A non-volatile memory is configured to perform multiple leak tests integrated into a pre-erase process for a set (e.g., block) of non-volatile memory cells after the set of non-volatile memory cells have received programming. An inference circuit is configured to use results of the leak tests with a pre-trained model to predict whether the set of non-volatile memory cells will fail.

20 Claims, 21 Drawing Sheets

(56)        References Cited

U.S. PATENT DOCUMENTS

| | | | |
|---|---|---|---|
| 2021/0110244 A1 | 4/2021 | Hoang | |
| 2021/0173734 A1 | 6/2021 | Lee | |
| 2021/0182152 A1 | 6/2021 | Shin et al. | |
| 2021/0192325 A1 | 6/2021 | Hoang | |
| 2021/0271549 A1 | 9/2021 | Khayat et al. | |
| 2021/0342204 A1 | 11/2021 | Choudhury et al. | |
| 2022/0076757 A1* | 3/2022 | Parthasarathy | G11C 16/26 |
| 2022/0365842 A1 | 11/2022 | Jeong | |
| 2022/0383966 A1 | 12/2022 | Huang | |
| 2023/0080002 A1 | 3/2023 | Angilella | |
| 2023/0315330 A1 | 10/2023 | Li et al. | |

OTHER PUBLICATIONS

PCT International Search Report and Written Opinion dated Sep. 21, 2022, PCT Patent Application No. PCT/US2022/028424.
Notice of Allowance date mailed Apr. 26, 2023, U.S. Appl. No. 17/503,612.
PCT International Search Report and Written Opinion dated Nov. 13, 2024, PCT Patent Application No. PCT/US2024/040817.

* cited by examiner

184

130

Interface memory bus (data lines and chip enable lines)

182

Memory Die Assembly
180

Memory Die Asssembly
180

Memory Die Assembly
180

• • •

Memory Die Assembly
180

Block M-1

Block M-1

Block 2

Block 2

Block 1

Block 1

Block 0

Block 0

Figure 9

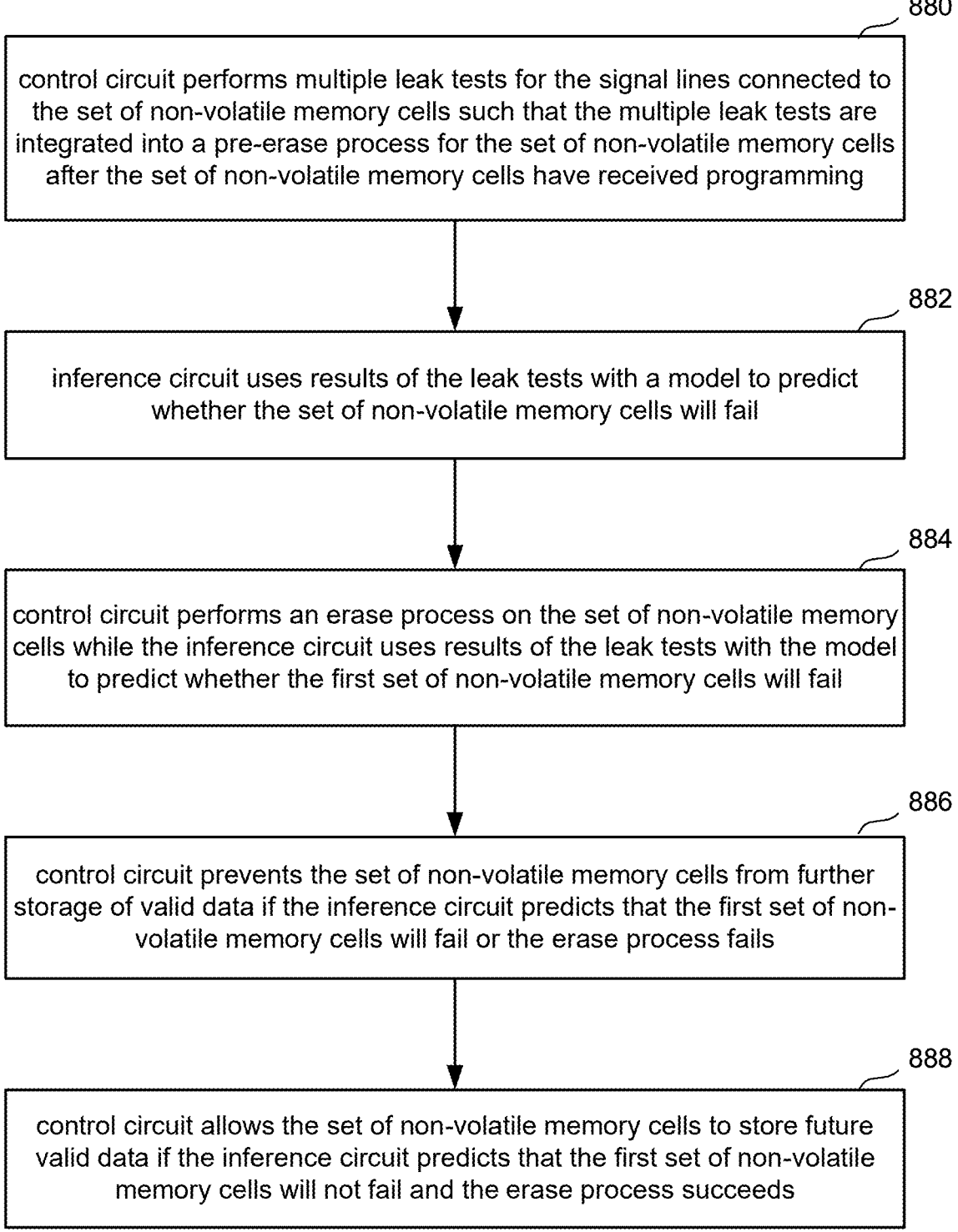

880 control circuit performs multiple leak tests for the signal lines connected to the set of non-volatile memory cells such that the multiple leak tests are integrated into a pre-erase process for the set of non-volatile memory cells after the set of non-volatile memory cells have received programming

882 inference circuit uses results of the leak tests with a model to predict whether the set of non-volatile memory cells will fail

884 control circuit performs an erase process on the set of non-volatile memory cells while the inference circuit uses results of the leak tests with the model to predict whether the first set of non-volatile memory cells will fail

886 control circuit prevents the set of non-volatile memory cells from further storage of valid data if the inference circuit predicts that the first set of non-volatile memory cells will fail or the erase process fails

888 control circuit allows the set of non-volatile memory cells to store future valid data if the inference circuit predicts that the first set of non-volatile memory cells will not fail and the erase process succeeds

NON-VOLATILE MEMORY WITH LEAK TESTS

BACKGROUND

The present disclosure relates to non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery). One example of non-volatile memory is flash memory (e.g., NAND-type and NOR-type flash memory).

Users of non-volatile memory can program (e.g., write) data to the non-volatile memory and later read that data back. For example, a digital camera may take a photograph and store the photograph in non-volatile memory. Later, a user of the digital camera may view the photograph by having the digital camera read the photograph from the non-volatile memory. Because users often rely on the data they store, it is important to users of non-volatile memory to be able to store data reliably so that it can be read back successfully.

BRIEF DESCRIPTION OF THE DRAWINGS

Like-numbered elements refer to common components in the different figures.

FIG. 4A is a block diagram of one embodiment of a memory structure having two planes.

FIG. 9 is a flow chart describing one embodiment of a process for performing leak test integrated into a pre-erase process for a set of non-volatile memory cells in order to predict whether the set of non-volatile memory cells will fail.

DETAILED DESCRIPTION

A non-volatile memory is configured to perform multiple leak tests integrated into a pre-erase process for a set (e.g., block) of non-volatile memory cells. An inference circuit is configured to use results of the leak tests with a pre-trained model to predict whether the set of non-volatile memory cells will fail.

Figure 1:
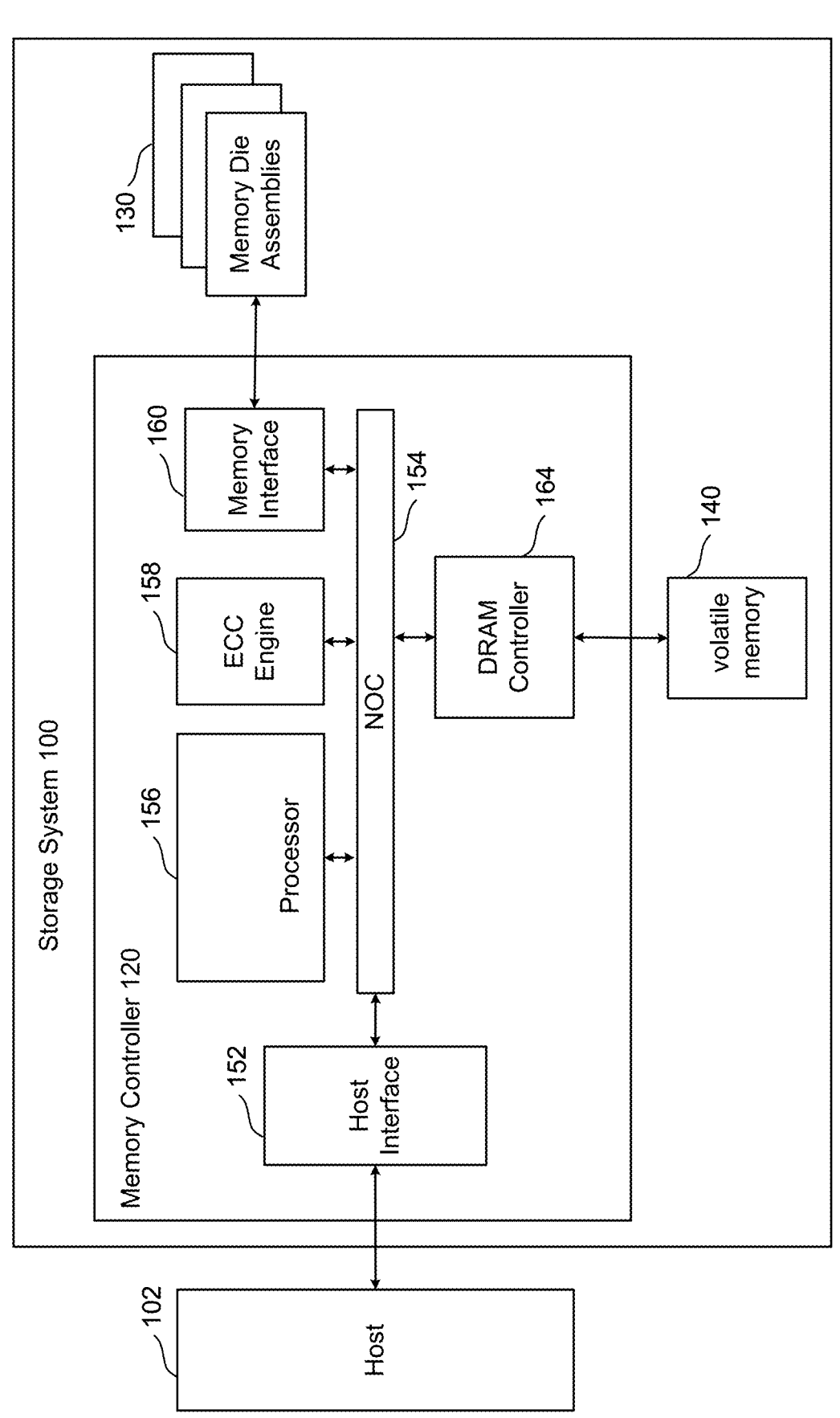
FIG. 1 is a block diagram depicting one embodiment of a storage system.

FIG. 1 is a block diagram of one embodiment of a storage system 100 that implements the proposed technology described herein. In one embodiment, storage system 100 is a solid state drive ("SSD"). Storage system 100 can also be a memory card, USB drive or other type of storage system. The proposed technology is not limited to any one type of memory system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 connected to one or more memory die assemblies 130 and local high speed volatile memory 140 (e.g., DRAM). Local high speed volatile memory 140 is used by memory controller 120 to perform certain functions. For example, local high speed volatile memory 140 stores logical to physical address translation tables ("L2P tables").

Memory controller 120 comprises a host interface 152 that is connected to and in communication with host 102. In one embodiment, host interface 152 implements a NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and DRAM controller 164. DRAM controller 164 is used to operate and communicate with local high speed volatile memory 140 (e.g., DRAM). In other embodiments, local high speed volatile memory 140 can be SRAM or another type of volatile memory.

ECC engine 158 performs error correction services. For example, ECC engine 158 performs data encoding and decoding, as per the implemented ECC technique. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory dies. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in the one or more memory die assemblies 130 and a subset of the L2P tables are cached (L2P cache) in the local high speed volatile memory 140.

Memory interface 160 communicates with the one or more memory die assemblies 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2:
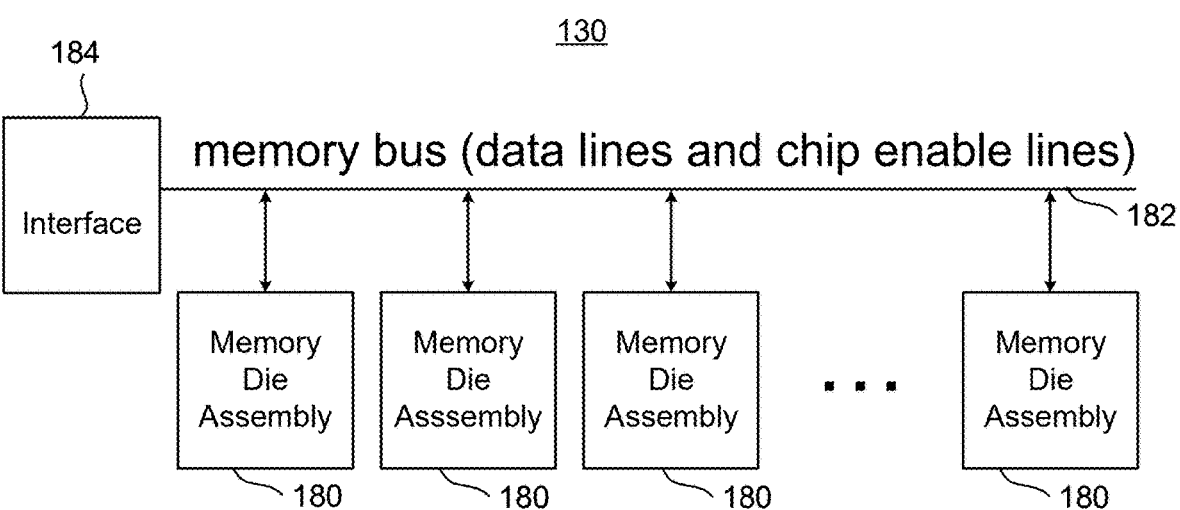
FIG. 2 is a block diagram depicting one embodiment of the one or more memory die assemblies.

FIG. 2 is a block diagram depicting one embodiment of the one or more memory die assemblies 130 of FIG. 1. FIG. 2 shows the one or more memory die assemblies 130 comprises a plurality of individual memory die assemblies 180 connected to a memory bus (data lines and chip enable lines) 182. The memory bus 182 connects to interface 184 (e.g., a Toggle Mode Interface) for communicating with memory controller 120. The technology described herein is not limited to any particular number of memory die assemblies 180.

Figure 2A:
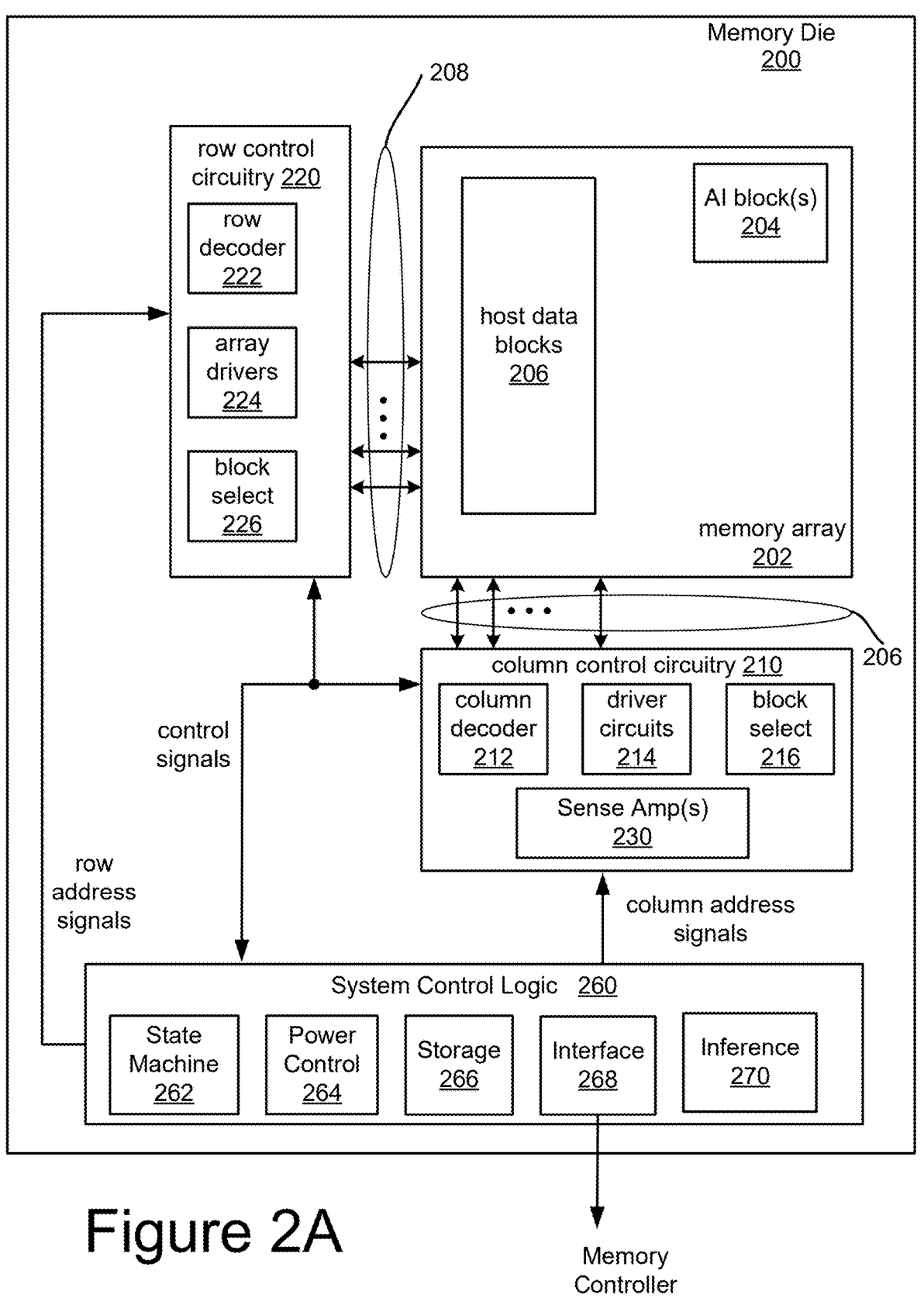
FIG. 2A is a block diagram of one embodiment of a memory die.

FIG. 2A is a functional block diagram of memory die 200, which is one embodiment of a memory die assembly 180. The components depicted in FIG. 2A are electrical circuits. Memory die 200 includes a non-volatile memory array 202 (which is one example of a non-volatile memory structure) that can comprises non-volatile memory cells, as described in more detail below. The array terminal lines of memory array 202 include the various layer(s) of word lines organized as rows, and the various layer(s) of bit lines organized as columns. However, other orientations can also be implemented. Memory die 200 includes row control circuitry 220, whose outputs 208 are connected to respective word lines of the memory array 202. Row control circuitry 220 receives a group of M row address signals and one or more various control signals from System Control Logic circuit 206, and typically may include such circuits as row decoders 222, array terminal drivers 224, and block select circuitry 226 for both reading and writing (programming) operations. Row control circuitry 220 may also include read/write circuitry. Memory die 200 also includes column control circuitry 210 including sense amplifier(s) 230 whose input/outputs 206 are connected to respective bit lines of the memory array 202. Although only single block is shown for array 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select circuitry 216, as well as read/write circuitry, and I/O multiplexers.

System control logic 260 receives data and commands from memory controller 120 and provides output data and status to the host. In some embodiments, the system control logic 260 (which comprises one or more electrical circuits) include state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 260 can also include a power control module 264 that controls the power and voltages supplied to the rows and columns of the memory array 202 during memory operations and may include charge pumps and regulator circuit for creating regulating voltages. System control logic 260 includes storage 266 (e.g., RAM, registers, latches, etc.), which may be used to store parameters for operating the memory array 202.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 360, can be formed as part of a single die. In other embodiments, some or all of the system control logic 260 can be formed on a different die.

In one embodiment, memory array 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory array 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory array 202 is not limited to the examples above. Many different types of memory array architectures or memory technologies can be used to form memory array 202. No particular non-volatile memory technology is required for purposes of the new claimed embodiments proposed herein. Other examples of suitable technologies for memory cells of the memory array/structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory array 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

In one embodiment, memory array 202 comprises a first set of non-volatile memory cells 206 configured to store host data (e.g., data received from a host or user) and a second set of non-volatile memory cells 204 that store one or more pre-trained models received pre-trained from a source external to the non-volatile storage apparatus. In one embodiment, the second set of non-volatile memory cells 204 that store the pre-trained models comprises one or more blocks of memory cells (e.g., one or more erase blocks dedicated to storing the pre-trained model, where an erase block is the unit of erase), referred to as Artificial Intelligence ("AI") block(s). More details about the pre-trained model are provided below.

In one embodiment, the System Control Logic 260 (e.g., which is configured to write to and read from the memory array 202) further includes an inference circuit 270 (e.g., an electrical circuit), which is also referred to as an AI circuit. In the embodiment of FIG. 2A, the inference circuit 270 and the memory array are positioned in the memory die assembly (e.g. on memory die 200). In one embodiment, inference circuit 270, is configured to use the pre-trained model from the second set of non-volatile memory cells 204 (AI blocks) with one or more metrics describing current operation of storage system 100 (e.g., the results of leak tests) in order to predict a defect in the storage system 100 and perform a countermeasure to preserve the host data prior to a non-recoverable failure in the storage system 100 due to the defect. More details are provided below.

The elements of FIG. 2A can be grouped into two parts: (1) memory array 202 and (2) peripheral circuitry, where peripheral circuitry includes all of the components depicted in FIG. 2A other than memory array 202. An important characteristic of a memory circuit is its capacity, which can be increased by increasing the area of the memory die of storage system 100 that is given over to the memory array 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory array 202 and the amount of area to devote to the peripheral circuitry.

Another area in which the memory array 202 and the peripheral circuitry are often at odds is in the processing involved in forming these regions, since these regions often involve differing processing technologies and the trade-off in having differing technologies on a single die. For example, when the memory array 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 2A onto separately formed dies that are then bonded together. More specifically, the memory array 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more die, such as two memory die and one control die, for example.

Figure 2B:
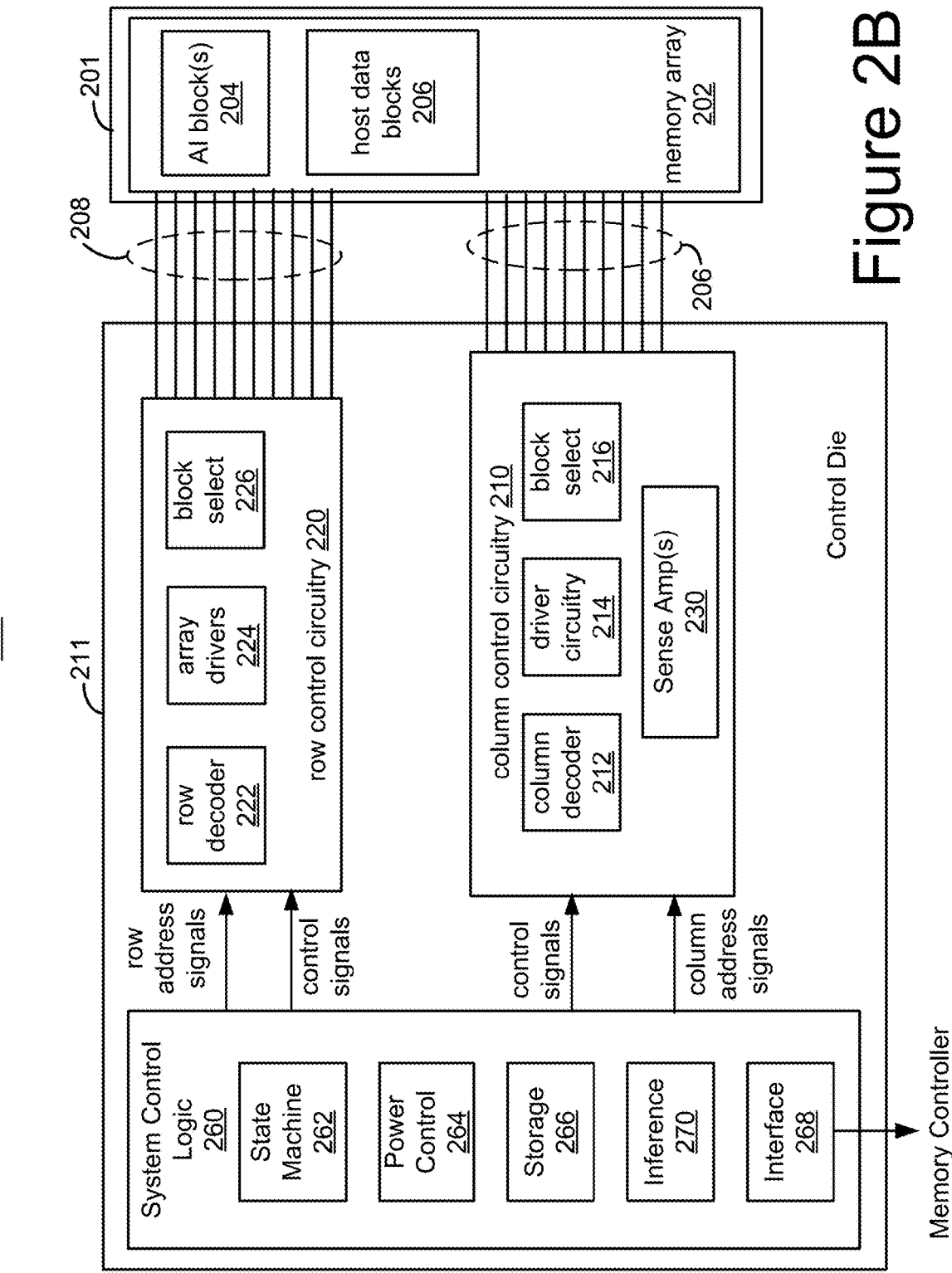
FIG. 2B is a block diagram of one embodiment of an integrated memory assembly.

FIG. 2B shows an alternative arrangement to that of FIG. 2A which may be implemented using wafer-to-wafer bonding to provide a bonded die pair comprising a memory die and a control die. In that regard, FIG. 2B is a functional block diagram of integrated memory assembly 207, which is another embodiment of a memory die assembly 180. The components depicted in FIG. 2B are electrical circuits. The integrated memory assembly 207 includes two types of semiconductor die (or more succinctly, "die"). Memory die 201 includes memory array 202. Memory array 202 includes non-volatile memory cells. Control die 211 includes control circuitry 260, 210, and 220 (as described above). In some embodiments, control die 211 is configured to connect to the memory array 202 in the memory die 201. In some embodiments, the memory die 201 and the control die 211 are bonded together.

FIG. 2B shows an example of the peripheral circuitry, including control circuits, formed in a peripheral circuit or control die 211 coupled to memory array 202 formed in memory die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory die 201. In some embodiments, some of the circuitry in the system control logic 260 is located on the memory die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including sense amplifier(s) 230 on the control die 211 coupled to memory array 202 on the memory die 201 through electrical paths 206. For example, electrical paths 206 may provide electrical connection between column decoder 212, driver circuitry 214, and block select 216 and bit lines of memory array 202. Electrical paths may extend from column control circuitry 210 in control die 211 through pads on control die 211 that are bonded to corresponding pads of the memory die 201, which are connected to bit lines of memory array 202. Each bit line of memory array 202 may have a corresponding electrical path in electrical paths 306, including a pair of bond pads, which connects to column control circuitry 210. Similarly, row control circuitry 220, including row decoder 222, array drivers 224, and block select 226 are coupled to memory array 202 through electrical paths 208. Each of electrical path 208 may correspond to a word line, dummy word line, or select gate line. Additional electrical paths may also be provided between control die 211 and memory die 201.

As in FIG. 2A, the system control logic 260 of FIG. 2B includes inference circuit 270 which is configured to use the pre-trained model from the second set of non-volatile memory cells 204 with one or more metrics describing current operation of storage system 100 (e.g., results of leak tests) in order to predict a defect in the storage system 100 and perform a countermeasure to preserve the host data prior to a non-recoverable failure in the storage system 100 due to the defect. Thus, FIG. 2B depicts an embodiment in which the memory die assembly comprises a memory die bonded to control die, the non-volatile memory is positioned on the memory die, and the inference circuit is positioned on the control die.

For purposes of this document, the phrases "a control circuit" or "one or more control circuits" can include any one of or any combination of memory controller 120, state machine 262, all or a portion of system control logic 260 (e.g., including inference circuit 270), all or a portion of row control circuitry 220, all or a portion of column control circuitry 210, a microcontroller, a microprocessor, and/or other similar functioned circuits. The control circuit can include hardware only or a combination of hardware and software (including firmware). For example, a controller programmed by firmware to perform the functions described herein is one example of a control circuit. A control circuit can include a processor, FGA, ASIC, integrated circuit, or other type of circuit. In another example, the control circuit can include memory controller 120 in combination with all of the components of FIG. 2A or 2B, excluding memory array 202.

Figures 3A, 3B:
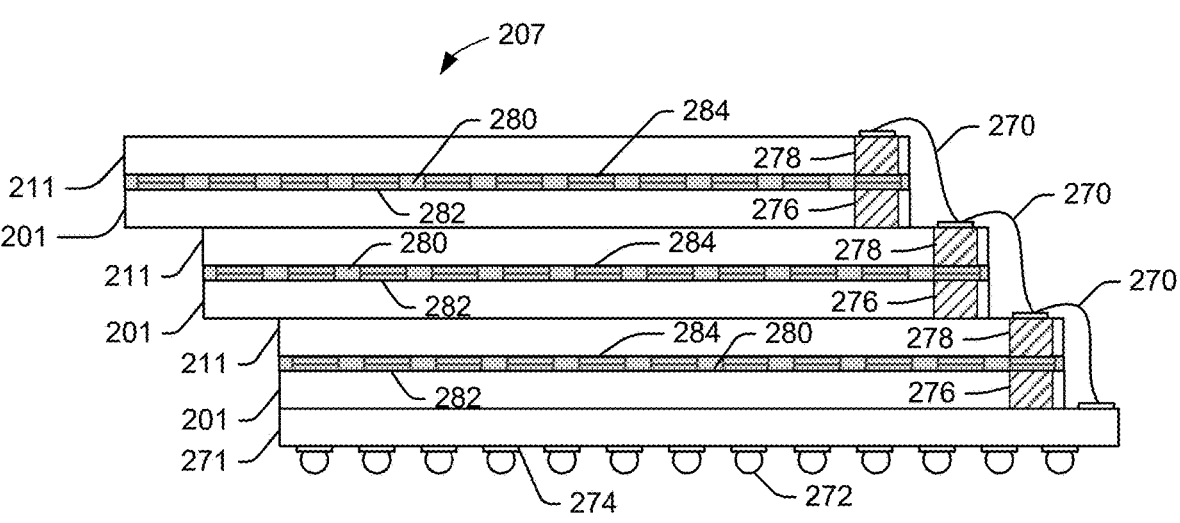
FIGS. 3A and 3B depict different embodiments of integrated memory assemblies.

In some embodiments, there is more than one control die 211 and more than one memory die 201 in an integrated memory assembly 207. In some embodiments, the integrated memory assembly 207 includes a stack of multiple control die 211 and multiple memory die 201. FIG. 3A depicts a side view of an embodiment of an integrated memory assembly 207 stacked on a substrate 271 (e.g., a stack comprising control dies 211 and memory dies 201). The integrated memory assembly 207 has three control dies 211 and three memory dies 201. In some embodiments, there are more than three memory die 201 and more than three control dies 211.

Each control die 211 is affixed (e.g., bonded) to at least one of the memory dies 201. Some of the bond pads 282/284 are depicted. There may be many more bond pads. A space between two dies 201, 211 that are bonded together is filled with a solid layer 280, which may be formed from epoxy or other resin or polymer. This solid layer 280 protects the electrical connections between the dies 201, 211, and further secures the dies together. Various materials may be used as solid layer 280, but in embodiments, it may be Hysol epoxy resin from Henkel Corp., having offices in California, USA.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 3A).

A memory die through silicon via (TSV) 276 may be used to route signals through a memory die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

FIG. 3B depicts a side view of another embodiment of an integrated memory assembly 207 stacked on a substrate 271. The integrated memory assembly 207 of FIG. 3B has three control die 211 and three memory die 201. In some embodiments, there are many more than three memory dies 201 and many more than three control dies 211. In this example, each control die 211 is bonded to at least one memory die 201. Optionally, a control die 211 may be bonded to two or more memory die 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 3A, the integrated memory assembly 207 in FIG. 3B does not have a stepped offset. A memory die through silicon via (TSV) 276 may be used to route signals through a memory die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory die 201 may be bonded together. Bond pads on each die 201, 211 may be used to bond the two dies together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 μm square and spaced from each other with a pitch of 5 μm to 5 μm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 μm square and spaced from each other with a pitch of 1 μm to 5 μm. Bonding techniques may be used providing bond pads with even smaller (or greater) sizes and pitches.

Some embodiments may include a film on the surface of the dies 201, 211. Where no such film is initially provided, a space between the dies may be under filled with an epoxy or other resin or polymer. The under-fill material may be applied as a liquid which then hardens into a solid layer. This under-fill step protects the electrical connections between the dies 201, 211, and further secures the dies together. Various materials may be used as under-fill material, but in embodiments, it may be Hysol epoxy resin from Henkel Corp., having offices in California, USA.

Figure 4:
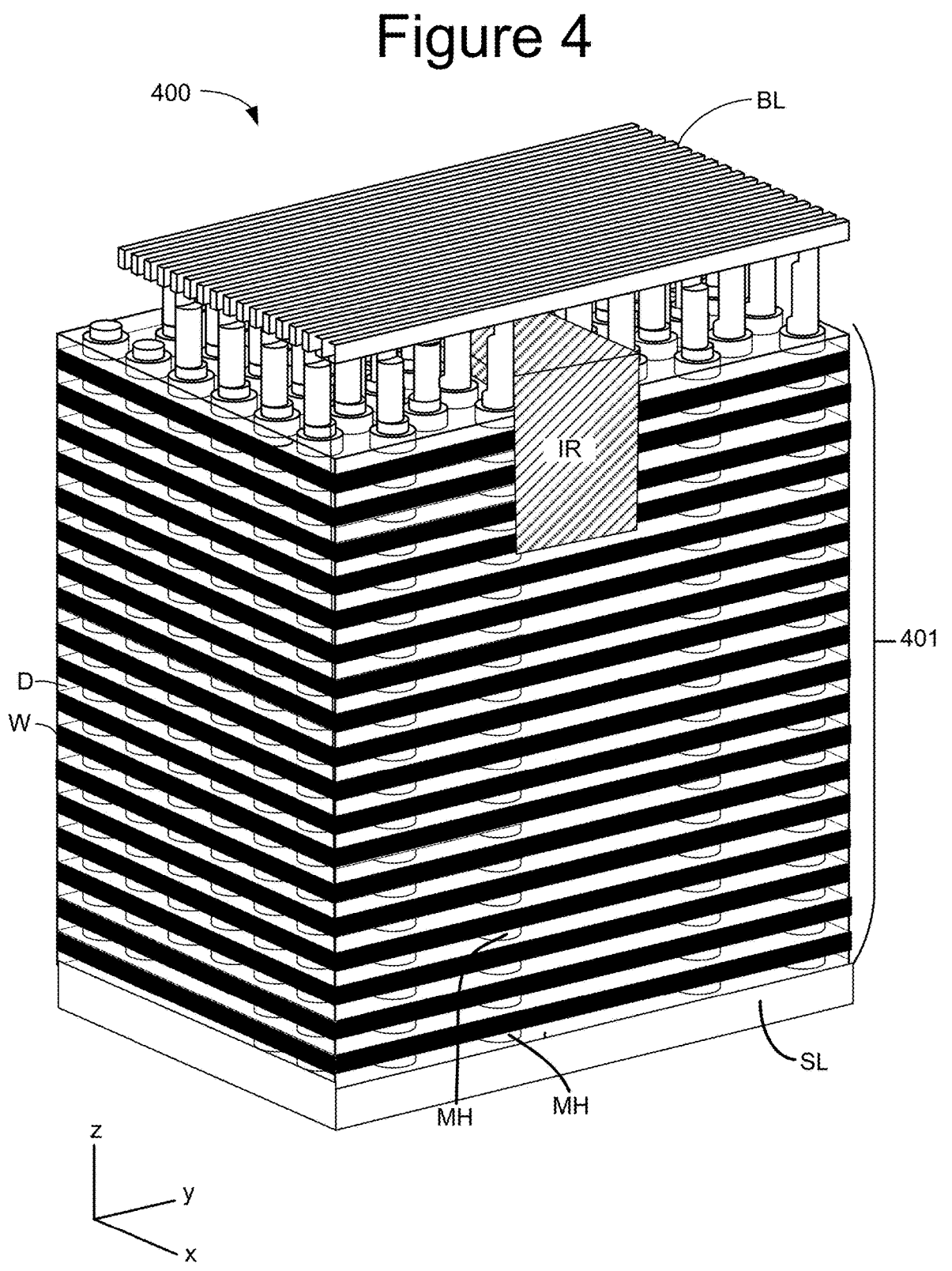
FIG. 4 is a perspective view of a portion of one embodiment of a monolithic three dimensional memory structure.

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. As will be explained below, in one embodiment the alternating dielectric layers and conductive layers are divided into four or five (or a different number of) regions by isolation regions IR. FIG. 4 shows one isolation region IR separating two regions. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. Thus, the non-volatile memory cells are arranged in memory holes. More details of the three dimensional monolithic memory array that comprises memory structure 202 is provided below.

Figure 4A:
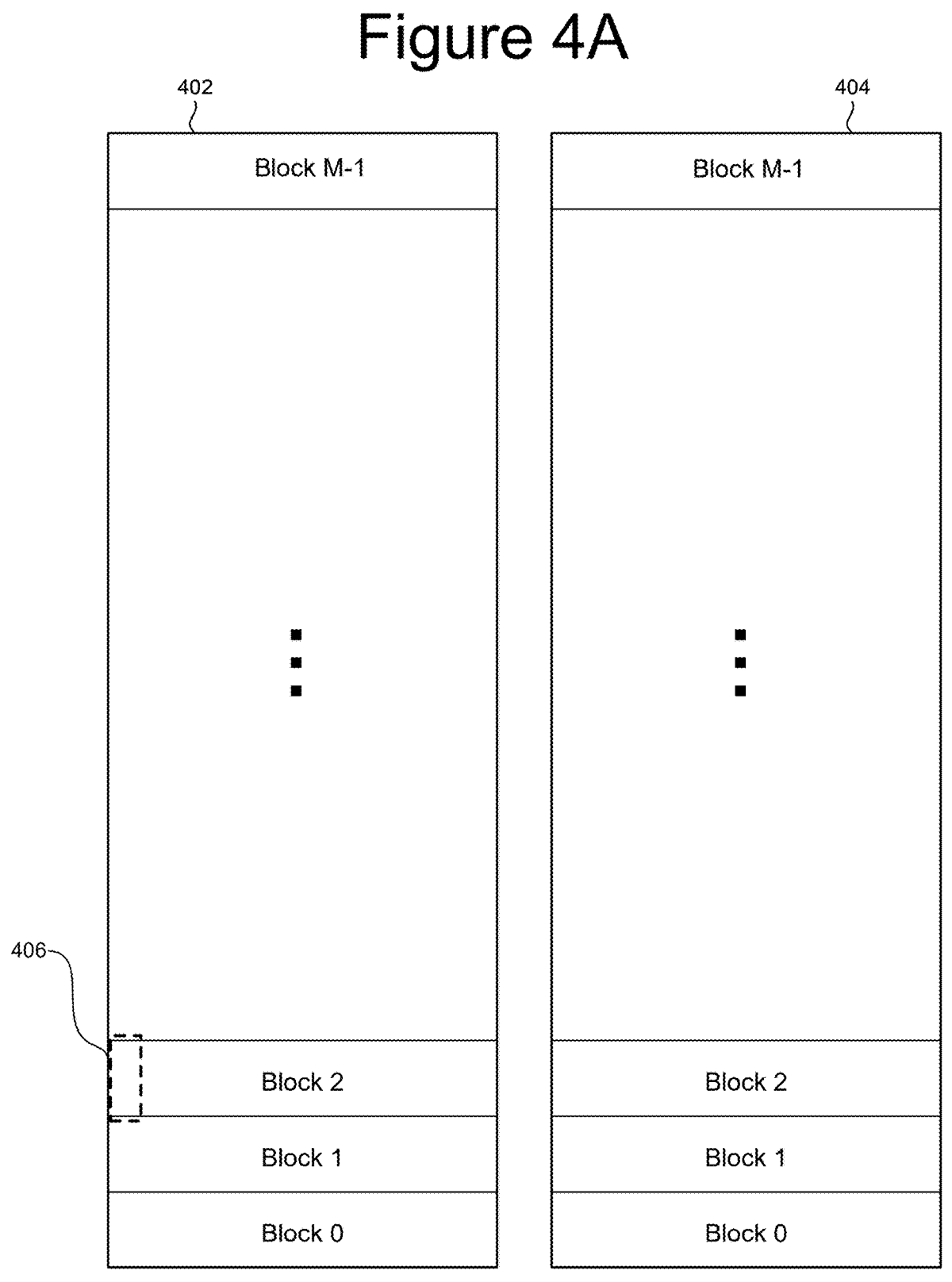

FIG. 4A is a block diagram explaining one example organization of memory structure 202, which is divided into two planes 402 and 404. Each plane is then divided into M blocks. In one example, each plane has about 2000 blocks. However, different numbers of blocks and planes can also be used. In one embodiment, a block of memory cells is a unit of erase. That is, all memory cells of a block are erased together. In other embodiments, blocks can be divided into sub-blocks and the sub-blocks can be the unit of erase. Memory cells can also be grouped into blocks for other reasons, such as to organize the memory structure to enable the signaling and selection circuits. In some embodiments, a block represents a groups of connected memory cells as the memory cells of a block share a common set of word lines. For example, the word lines for a block are all connected to all of the vertical NAND strings for that block. Although FIG. 4A shows two planes 402/404, more or less than two planes can be implemented. In some embodiments, memory structure 202 includes eight planes.

Figure 4B:
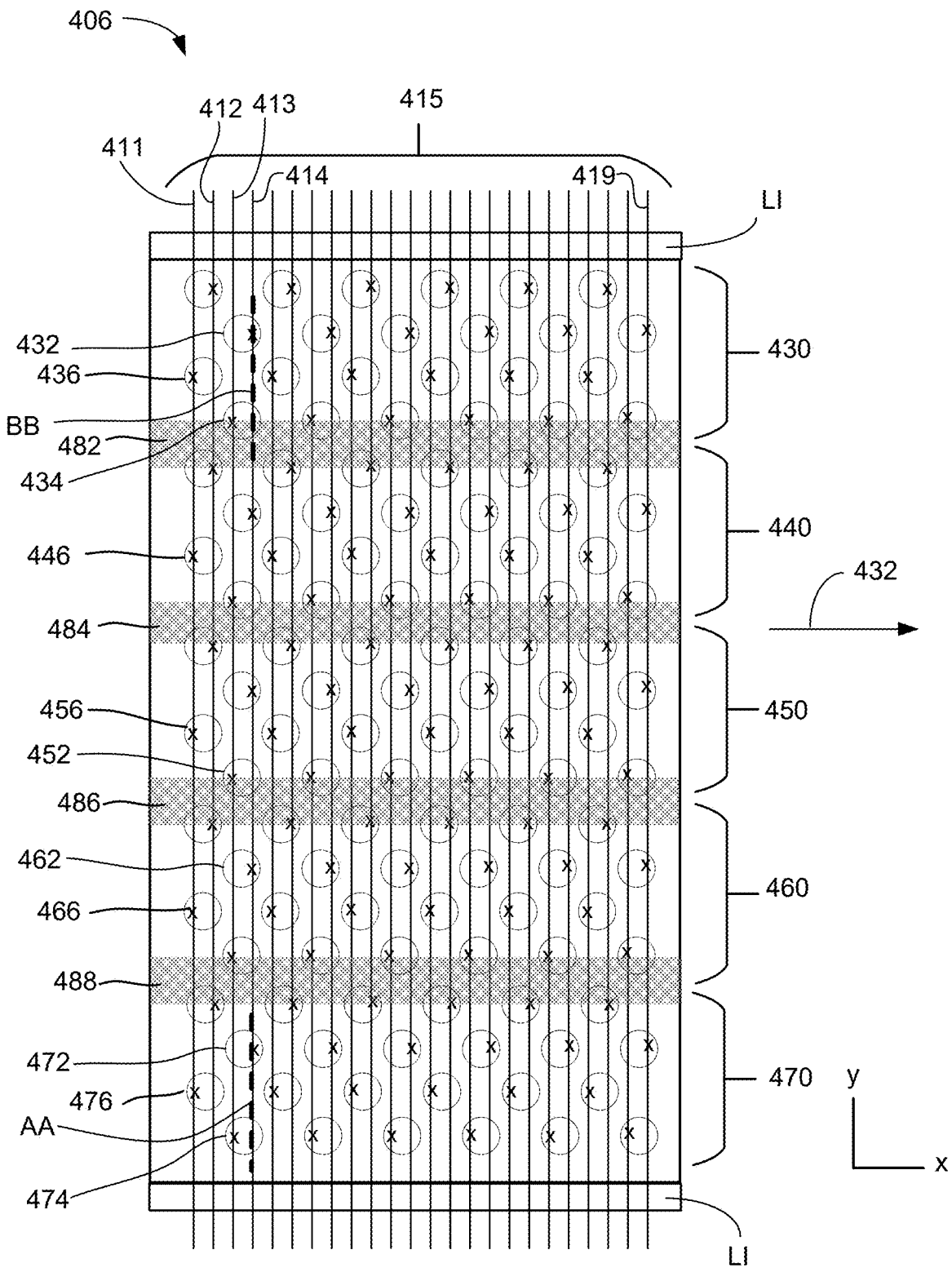
FIG. 4B depicts a top view of a portion of one embodiment of a block of memory cells.

FIGS. 4B-4F depict an example three dimensional ("3D") NAND structure that corresponds to the structure of FIG. 4 and can be used to implement memory structure 202 of FIGS. 2A and 2B. FIG. 4B is a block diagram depicting a top view of a portion 406 of Block 2 of plane 402. As can be seen from FIG. 4B, the block depicted in FIG. 4B extends in the direction of 432. In one embodiment, the memory array has many layers; however, FIG. 4B only shows the top layer.

FIG. 4B depicts a plurality of circles that represent the memory holes, which are also referred to as vertical columns. Each of the memory holes/vertical columns include multiple select transistors (also referred to as a select gate or selection gate) and multiple memory cells. In one embodiment, each memory hole/vertical column implements a NAND string. For example, FIG. 4B labels a subset of the memory holes/vertical columns/NAND strings 432, 436, 446, 456, 462, 466, 472, 474 and 476.

FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to memory holes/vertical columns of the block. Each of the circles representing memory holes/vertical columns has an "x" to indicate its connection to one bit line. For example, bit line 411 is connected to memory holes/vertical columns 436, 446, 456, 466 and 476.

The block depicted in FIG. 4B includes a set of isolation regions 482, 484, 486 and 488, which are formed of $SiO_2$; however, other dielectric materials can also be used. Isolation regions 482, 484, 486 and 488 serve to divide the top layers of the block into five regions; for example, the top layer depicted in FIG. 4B is divided into regions 430, 440, 450, 460 and 470. In one embodiment, the isolation regions only divide the layers used to implement select gates so that NAND strings in different regions can be independently selected. In one example implementation, a bit line connects to one memory hole/vertical column/NAND string in each of regions 430, 440, 450, 460 and 470. In that implementation, each block has twenty four rows of active columns and each bit line connects to five rows in each block. In one embodiment, all of the five memory holes/vertical columns/ NAND strings connected to a common bit line are connected to the same set of word lines; therefore, the system uses the drain side selection lines to choose one (or another subset) of the five to be subjected to a memory operation (program, verify, read, and/or erase).

FIG. 4B also shows Line Interconnects LI, which are metal connections to the source line SL from above the memory array. Line Interconnects LI are positioned adjacent regions 430 and 470.

Although FIG. 4B shows each region 430, 440, 450, 460 and 470 having four rows of memory holes/vertical columns, five regions and twenty four rows of memory holes/ vertical columns in a block, those exact numbers are an example implementation. Other embodiments may include more or less regions per block, more or less rows of memory holes/vertical columns per region and more or less rows of vertical columns per block. FIG. 4B also shows the memory holes/vertical columns being staggered. In other embodiments, different patterns of staggering can be used. In some embodiments, the memory holes/vertical columns are not staggered.

Figure 4C:
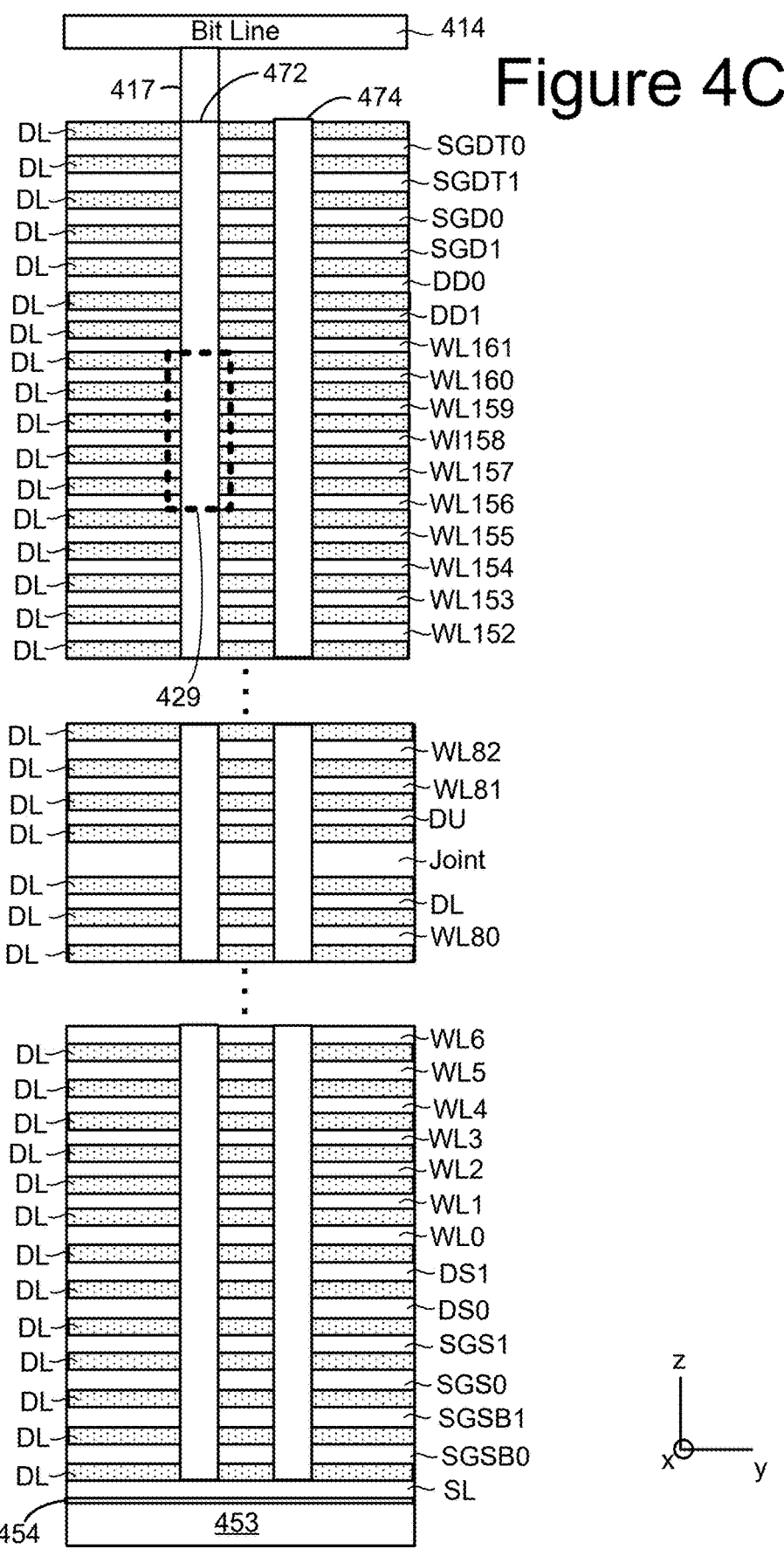
FIG. 4C depicts a cross sectional view of a portion of one embodiment of a block of memory cells.

FIG. 4C depicts a portion of one embodiment of a three-dimensional memory structure 202 showing a cross-sectional view along line AA of FIG. 4B. This cross-sectional view cuts through memory holes/vertical columns (NAND strings) 472 and 474 of region 470 (see FIG. 4B). The structure of FIG. 4C includes two drain side select layers SGD0 and SGD1; two source side select layers SGS0 and SGS1; two drain side GIDL generation transistor layers SGDT0 and SGDT1; two source side GIDL generation transistor layers SGSB0 and SGSB1; two drain side dummy word line layers DD0 and DD1; two source side dummy word line layers DS0 and DS1; dummy word line layers DU and DL; one hundred and sixty two word line layers WL0-WL161 for connecting to data memory cells, and dielectric layers DL. Other embodiments can implement more or less than the numbers described above for FIG. 4C. In one embodiment, SGD0 and SGD1 are connected together; and SGS0 and SGS1 are connected together. In other embodiments, more or less number of SGDs (greater or lesser than two) are connected together, and more or less numbers of SGSs (greater or lesser than two) are connected together.

In one embodiment, erasing the memory cells is performed using gate induced drain leak (GIDL), which includes generating charge carriers at the GIDL generation transistors such that the carriers get injected into the charge trapping layers of the NAND strings to change threshold voltage of the memory cells. FIG. 4C shows two GIDL generation transistors at each end of the NAND string;

however, in other embodiments there are more or less than three. Embodiments that use GIDL at both sides of the NAND string may have GIDL generation transistors at both sides. Embodiments that use GIDL at only the drain side of the NAND string may have GIDL generation transistors only at the drain side. Embodiments that use GIDL at only the source side of the NAND string may have GIDL generation transistors only at the source side.

FIG. 4C shows two GIDL generation transistors at each end of the NAND string. It is likely that charge carriers are only generated by GIDL at one of the two GIDL generation transistors at each end of the NAND string. Based on process variances during manufacturing, it is likely that one of the two GIDL generation transistors at an end of the NAND string is best suited for GIDL. For example, the GIDL generation transistors have an abrupt pn junction to generate the charge carriers for GIDL and, during fabrication, a phosphorous diffusion is performed at the polysilicon channel of the GIDL generation transistors. In some cases, the GIDL generation transistor with the shallowest phosphorous diffusion is the GIDL generation transistor that generates the charge carriers during erase. However, in some embodiments charge carriers can be generated by GIDL at multiple GIDL generation transistors at a particular side of the NAND string.

Memory holes/vertical columns 472 and 474 are depicted protruding through the drain side select layers, source side select layers, dummy word line layers, GIDL generation transistor layers and word line layers. In one embodiment, each memory hole/vertical column comprises a vertical NAND string. Below the memory holes/vertical columns and the layers listed below is substrate 453, an insulating film 454 on the substrate, and source line SL. The NAND string of memory hole/vertical column 472 has a source end at a bottom of the stack and a drain end at a top of the stack. As in agreement with FIG. 4B, FIG. 4C shows vertical memory hole/column 472 connected to bit line 414 via connector 417.

For ease of reference, drain side select layers; source side select layers, dummy word line layers, GIDL generation transistor layers and data word line layers collectively are referred to as the conductive layers. In one embodiment, the conductive layers are made from a combination of TiN and Tungsten. In other embodiments, other materials can be used to form the conductive layers, such as doped polysilicon, metal such as Tungsten, metal silicide, such as nickel silicide, tungsten silicide, aluminum silicide or the combination thereof. In some embodiments, different conductive layers can be formed from different materials. Between conductive layers are dielectric layers DL. In one embodiment, the dielectric layers are made from $SiO_2$. In other embodiments, other dielectric materials can be used to form the dielectric layers.

The non-volatile memory cells are formed along memory holes/vertical columns which extend through alternating conductive and dielectric layers in the stack. In one embodiment, the memory cells are arranged in NAND strings. The word line layers WL0-WL161 connect to memory cells (also called data memory cells). Dummy word line layers connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. Drain side select layers SGD0 and SGD1 are used to electrically connect and disconnect NAND strings from bit lines. Source side select layers SGS0 and SGS1 are used to electrically connect and disconnect NAND strings from the source line SL.

FIG. 4C shows that the memory array is implemented as a two tier architecture, with the tiers separated by a Joint area. In one embodiment it is expensive and/or challenging to etch so many word line layers intermixed with dielectric layers. To case this burden, one embodiment includes laying down a first stack of word line layers (e.g., WL0-WL80) alternating with dielectric layers, laying down the Joint area, and laying down a second stack of word line layers (e.g., WL81-WL161) alternating with dielectric layers. The Joint area are positioned between the first stack and the second stack. In one embodiment, the Joint areas are made from the same materials as the word line layers. In other embodiments, there can no Joint area or there can be multiple Joint areas.

Figure 4D:
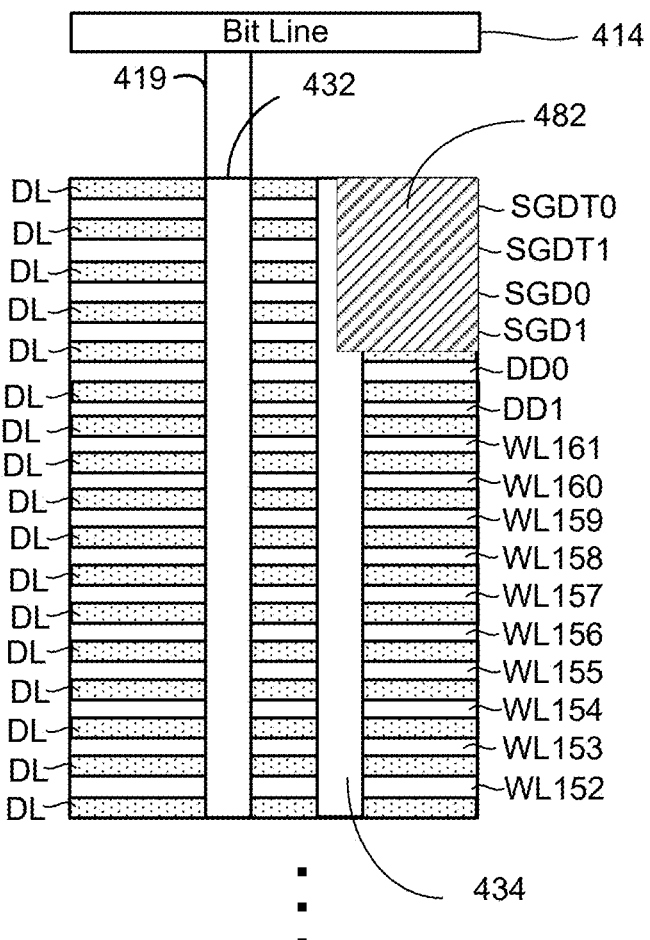
FIG. 4D depicts a cross sectional view of a portion of one embodiment of a block of memory cells.

FIG. 4D depicts a portion of one embodiment of a three-dimensional memory structure 202 showing a cross-sectional view along line BB of FIG. 4B. This cross sectional view cuts through memory holes/vertical columns (NAND strings) 432 and 434 of region 430 (see FIG. 4B). FIG. 4D shows the same alternating conductive and dielectric layers as FIG. 4C. FIG. 4D also shows isolation region 482. Isolation regions 482, 484, 486 and 488 occupy space that would have been used for a portion of the memory holes/vertical columns/NAND stings. For example, isolation region 482 occupies space that would have been used for a portion of memory hole/vertical column 434. More specifically, a portion (e.g., half the diameter) of vertical column 434 has been removed in layers SGDT0, SGDT1, SGD0, and SGD1 to accommodate isolation region 482. Thus, while most of the vertical column 434 is cylindrical (with a circular cross section), the portion of vertical column 434 in layers SGDT0, SGDT1, SGD0, and SGD1 has a semi-circular cross section. In one embodiment, after the stack of alternating conductive and dielectric layers is formed, the stack is etched to create space for the isolation region and that space is then filled in with $SiO_2$. This structure allows for separate control of SGDT0, SGDT1, SGD0, and SGD1 for regions 430, 440, 450, 460, and 470.

Figure 4E:
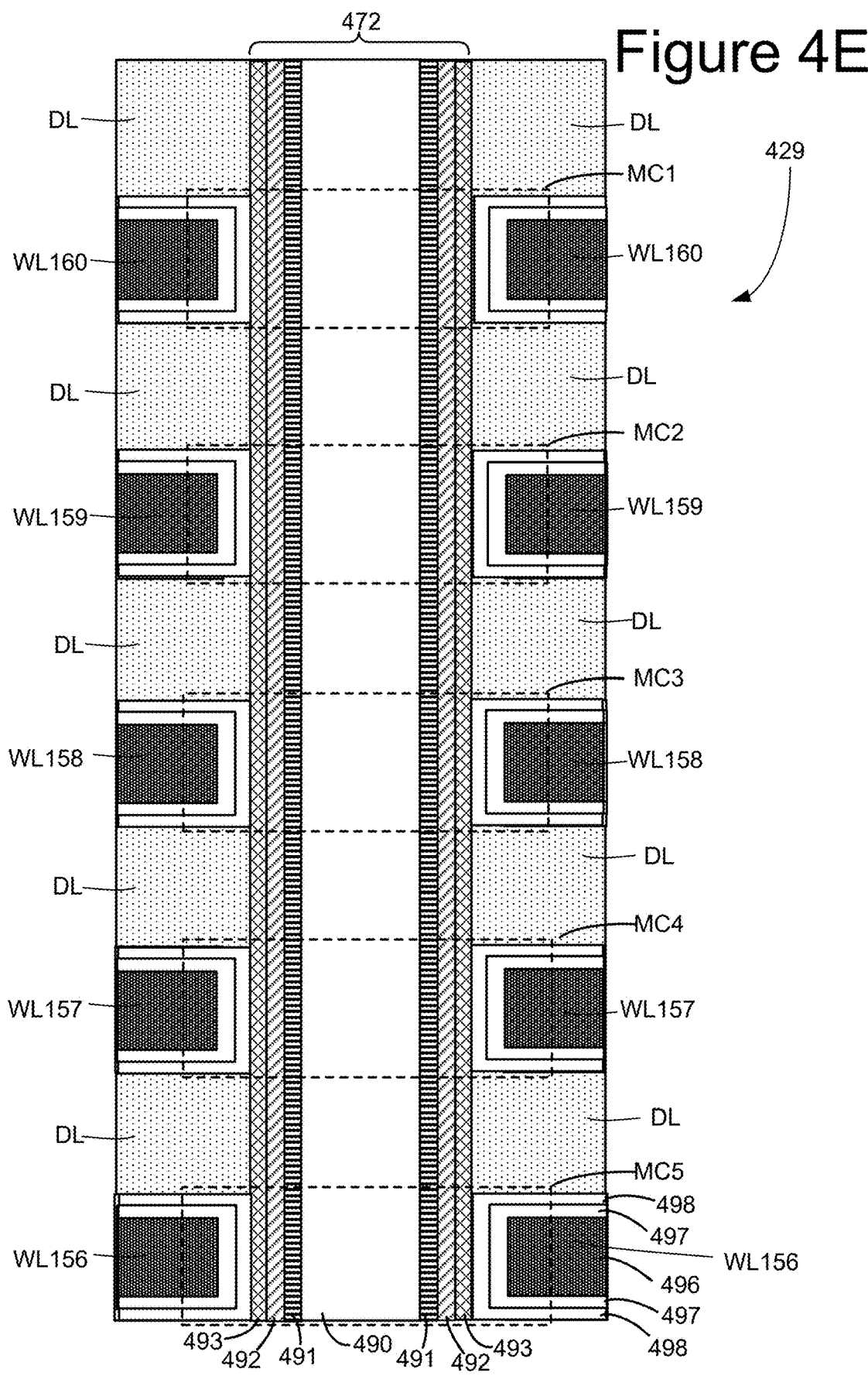
FIG. 4E is a cross sectional view of one embodiment of a vertical column of memory cells.

FIG. 4E depicts a cross sectional view of region 429 of FIG. 4C that includes a portion of memory hole/vertical column 472. In one embodiment, the memory holes/vertical columns are round; however, in other embodiments other shapes can be used. In one embodiment, memory hole/ vertical column 472 includes an inner core layer 490 that is made of a dielectric, such as $SiO_2$. Other materials can also be used. Surrounding inner core 490 is polysilicon channel 491. Materials other than polysilicon can also be used. Note that it is the channel 491 that connects to the bit line and the source line. Surrounding channel 491 is a tunneling dielectric 492. In one embodiment, tunneling dielectric 492 has an ONO structure. Surrounding tunneling dielectric 492 is charge trapping layer 493, such as (for example) Silicon Nitride. Other memory materials and structures can also be used. The technology described herein is not limited to any particular material or structure.

FIG. 4E depicts dielectric layers DL as well as word line layers WL160, WL159, WL158, WL157, and WL156. Each of the word line layers includes a word line region 496 surrounded by an aluminum oxide layer 497, which is surrounded by a blocking oxide layer 498. In other embodiments, the blocking oxide layer can be a vertical layer parallel and adjacent to charge trapping layer 493. The physical interaction of the word line layers with the vertical column forms the memory cells. Thus, a memory cell, in one embodiment, comprises channel 491, tunneling dielectric

492, charge trapping layer 493, blocking oxide layer 498, aluminum oxide layer 497 and word line region 496. For example, word line layer WL160 and a portion of memory hole/vertical column 472 comprise a memory cell MC1. Word line layer WL159 and a portion of memory hole/ vertical column 472 comprise a memory cell MC2. Word line layer WL158 and a portion of memory hole/vertical column 472 comprise a memory cell MC3. Word line layer WL157 and a portion of memory hole/vertical column 472 comprise a memory cell MC4. Word line layer WL156 and a portion of memory hole/vertical column 472 comprise a memory cell MC5. In other architectures, a memory cell may have a different structure; however, the memory cell would still be the storage unit.

When a memory cell is programmed, electrons are stored in a portion of the charge trapping layer 493 which is associated with (e.g. in) the memory cell. These electrons are drawn into the charge trapping layer 493 from the channel 491, through the tunneling dielectric 492, in response to an appropriate voltage on word line region 496. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as GIDL.

Figure 4F:
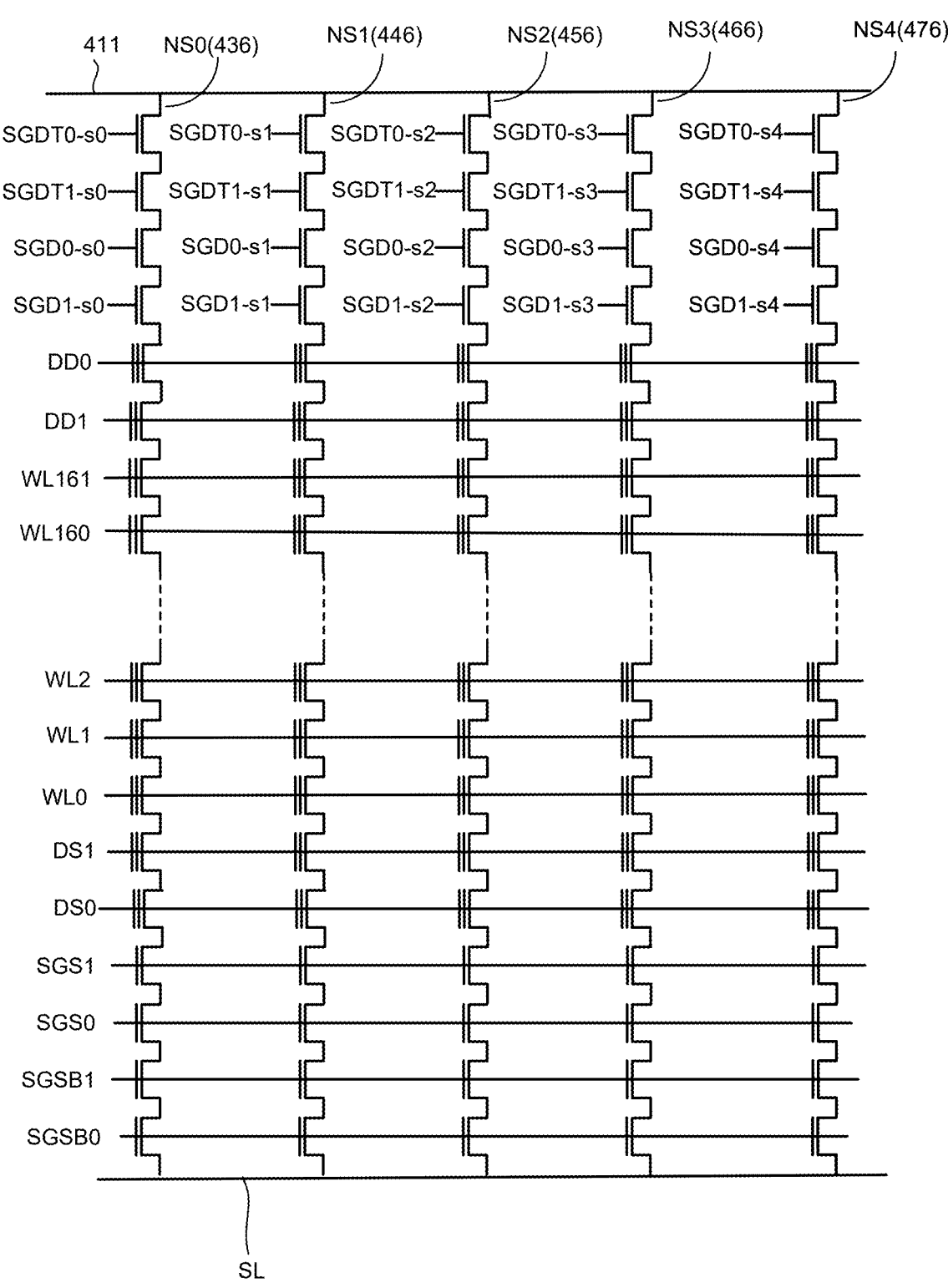
FIG. 4F is a schematic of a plurality of NAND strings in multiple regions of a same block.

FIG. 4F is a schematic diagram of a portion of the three-dimensional memory array 202 depicted in FIGS. 4-4E. FIG. 4F shows physical data word lines WL0-WL161 running across the entire block. The structure of FIG. 4F corresponds to a portion 406 in Block 2 of FIG. 4A, including bit line 411. Within the block, in one embodiment, each bit line is connected to five NAND strings, one in each region of regions 430, 440, 450, 460, 470. Thus, FIG. 4F shows bit line 411 connected to NAND string NS0 (which corresponds to memory hole/vertical column 436 of region 430), NAND string NS1 (which corresponds to memory hole/vertical column 446 of region 440), NAND string NS2 (which corresponds to vertical column 456 of region 450), NAND string NS3 (which corresponds to memory hole/ vertical column 466 of region 460), and NAND string NS4 (which corresponds to memory hole/vertical column 476 of region 470).

Drain side select line/layer SGD0 is separated by isolation regions 482, 484, 486 and 488 to form SGD0-s0, SGD0-s1, SGD0-s2, SGD0-s3 and SGD0-s4 in order to separately connect to and independently control regions 430, 440, 450, 460, 470. Similarly, drain side select line/layer SGD1 is separated by isolation regions 482, 484, 486 and 488 to form SGD1-s0, SGD1-s1, SGD1-s2, SGD1-s3 and SGD1-s4 in order to separately connect to and independently control regions 430, 440, 450, 460, 470; drain side GIDL generation transistor control line/layer SGDT0 is separated by isolation regions 482, 484, 486 and 488 to form SGDT0-s0, SGDT0-s1, SGDT0-s2, SGDT0-s3 and SGDT0-s4 in order to separately connect to and independently control regions 430, 440, 450, 460, 470; drain side GIDL generation transistor control line/layer SGDT1 is separated by isolation regions 482, 484, 486 and 488 to form SGDT1-s0, SGDT1-s1, SGDT1-s2, SGDT1-s3 and SGDT1-s4 in order to separately connect to and independently control regions 430, 440, 450, 460, 470.

FIG. 4F only shows NAND strings connected to bit line 411. However, a full schematic of the block would show every bit line and five vertical NAND strings (that are in separate regions) connected to each bit line.

Although the example memories of FIGS. 4-4F are three dimensional memory structure that includes vertical NAND strings with charge-trapping material, other (2D and 3D) memory structures can also be used with the technology described herein.

Figure 5A:
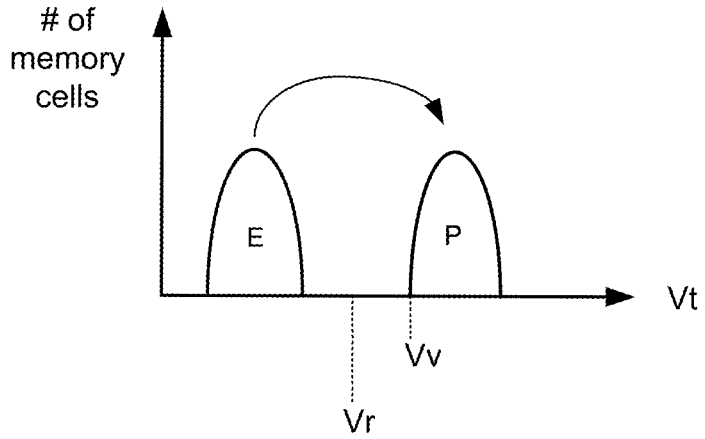
FIG. 5A depicts threshold voltage distributions.

The memory systems discussed above can be erased, programmed and read. At the end of a successful programming process, the threshold voltages of the memory cells should be within one or more distributions of threshold voltages for programmed memory cells or within a distribution of threshold voltages for erased memory cells, as appropriate. FIG. 5A is a graph of threshold voltage versus number of memory cells, and illustrates example threshold voltage distributions for the memory array when each memory cell stores one bit of data per memory cell. Memory cells that store one bit of data per memory cell data are referred to as single level cells ("SLC"). The data stored in SLC memory cells is referred to as SLC data; therefore, SLC data comprises one bit per memory cell. Data stored as one bit per memory cell is SLC data. FIG. 5A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." FIG. 5A depicts read reference voltage Vr. By testing (e.g., performing one or more sense operations) whether the threshold voltage of a given memory cell is above or below Vr, the system can determine a memory cells is erased (state E) or programmed (state P). FIG. 5A also depicts verify reference voltage Vv. In some embodiments, when programming memory cells to data state P, the system will test whether those memory cells have a threshold voltage greater than or equal to Vv.

Figure 5B:
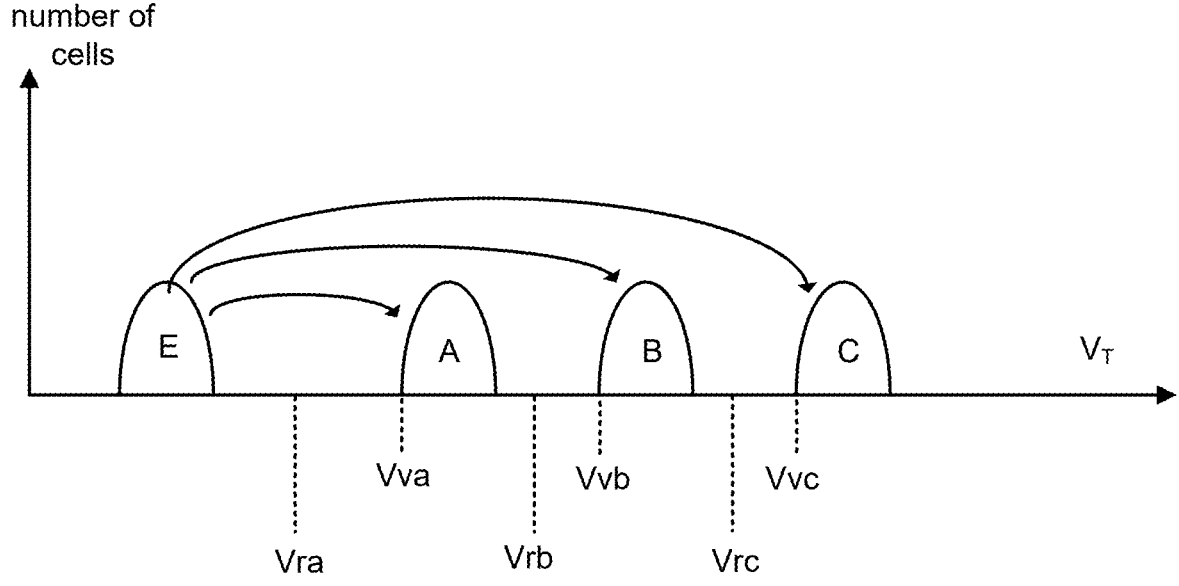
FIG. 5B depicts threshold voltage distributions.
Figures 5C, 5D:
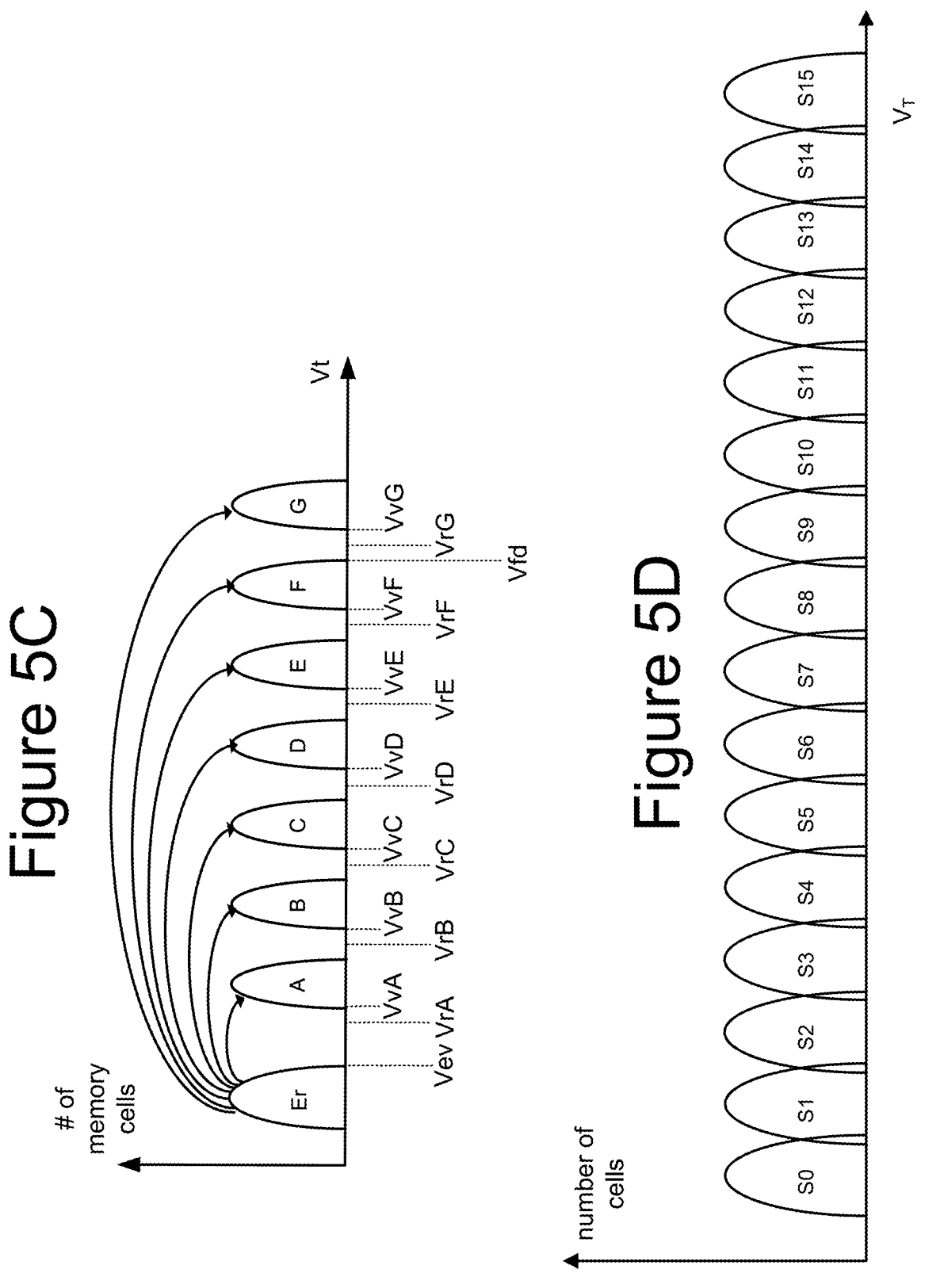
FIG. 5C depicts threshold voltage distributions.
FIG. 5D depicts threshold voltage distributions.

FIGS. 5B-D illustrate example threshold voltage distributions for the memory array when each memory cell stores multiple bit per memory cell data. Memory cells that store multiple bits per memory cell data are referred to as multilevel cells ("MLC"). The data stored in MLC memory cells is referred to as MLC data; therefore, MLC data comprises multiple bits per memory cell. Data stored as multiple bits of data per memory cell is MLC data. In the example embodiment of FIG. 5B, each memory cell stores two bits of data. Other embodiments may use other data capacities per memory cell (e.g., such as three, four, or five bits of data per memory cell).

FIG. 5B shows a first threshold voltage distribution E for erased memory cells. Three threshold voltage distributions A, B and C for programmed memory cells are also depicted. In one embodiment, the threshold voltages in the distribution E are negative and the threshold voltages in distributions A, B and C are positive. Each distinct threshold voltage distribution of FIG. 5B corresponds to predetermined values for the set of data bits. In one embodiment, each bit of data of the two bits of data stored in a memory cell are in different logical pages, referred to as a lower page (LP) and an upper page (UP). In other embodiments, all bits of data stored in a memory cell are in a common logical page. The specific relationship between the data programmed into the memory cell and the threshold voltage levels of the cell depends upon the data encoding scheme adopted for the cells. Table 1 provides an example encoding scheme.

TABLE 1

|    | E | A | B | C |
|----|---|---|---|---|
| LP | 1 | 0 | 0 | 1 |
| UP | 1 | 1 | 0 | 0 |

In one embodiment, known as full sequence programming, memory cells can be programmed from the erased data state E directly to any of the programmed data states A, B or C using the process of FIG. 6 (discussed below). For example, a population of memory cells to be programmed may first be erased so that all memory cells in the population are in erased data state E. Then, a programming process is used to program memory cells directly into data states A, B, and/or C. For example, while some memory cells are being programmed from data state E to data state A, other memory cells are being programmed from data state E to data state B and/or from data state E to data state C. The arrows of FIG. 5B represent the full sequence programming. In some embodiments, data states A-C can overlap, with memory controller 120 (or control die 211) relying on error correction to identify the correct data being stored.

FIG. 5C depicts example threshold voltage distributions for memory cells where each memory cell stores three bits of data per memory cell (which is another example of MLC data). FIG. 5C shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected. Table 2 provides an example of an encoding scheme for embodiments in which each bit of data of the three bits of data stored in a memory cell are in different logical pages, referred to as a lower page (LP), middle page (MP) and an upper page (UP).

TABLE 2

|    | Er | A | B | C | D | E | F | G |
|----|----|---|---|---|---|---|---|---|
| UP | 1  | 1 | 1 | 0 | 0 | 0 | 0 | 1 |
| MP | 1  | 1 | 0 | 0 | 1 | 1 | 0 | 0 |
| LP | 1  | 0 | 0 | 0 | 0 | 1 | 1 | 1 |

FIG. 5C shows seven read reference voltages, VrA, VrB, VrC, VrD, VrE, VrF, and VrG for reading data from memory cells. By testing (e.g., performing sense operations) whether the threshold voltage of a given memory cell is above or below the seven read reference voltages, the system can determine what data state (i.e., A, B, C, D, . . . ) a memory cell is in.

FIG. 5C also shows seven verify reference voltages, VvA, VvB, VvC, VvD, VvE, VvF, and VvG. In some embodiments, when programming memory cells to data state A, the system will test whether those memory cells have a threshold voltage greater than or equal to VvA. When programming memory cells to data state B, the system will test whether the memory cells have threshold voltages greater than or equal to VvB. When programming memory cells to data state C, the system will determine whether memory cells have their threshold voltage greater than or equal to VvC. When programming memory cells to data state D, the system will test whether those memory cells have a threshold voltage greater than or equal to VvD. When programming memory cells to data state E, the system will test whether those memory cells have a threshold voltage greater than or equal to VvE. When programming memory cells to data state F, the system will test whether those memory cells have a threshold voltage greater than or equal to VvF. When programming memory cells to data state G, the system will test whether those memory cells have a threshold voltage greater than or equal to VvG. FIG. 5C also shows Vev, which is an erase verify reference voltage to test whether a memory cell has been properly erased.

In an embodiment that utilizes full sequence programming, memory cells can be programmed from the erased data state Er directly to any of the programmed data states A-G using the process of FIG. 6 (discussed below). For example, a population of memory cells to be programmed may first be erased so that all memory cells in the population are in erased data state Er. Then, a programming process is used to program memory cells directly into data states A, B, C, D, E, F, and/or G. For example, while some memory cells are being programmed from data state Er to data state A, other memory cells are being programmed from data state Er to data state B and/or from data state Er to data state C, and so on. The arrows of FIG. 5C represent the full sequence programming. In some embodiments, data states A-G can overlap, with control die 211 and/or memory controller 120 relying on error correction to identify the correct data being stored. Note that in some embodiments, rather than using full sequence programming, the system can use multi-pass programming processes known in the art.

In general, during verify operations and read operations, the selected word line is connected to a voltage (one example of a reference signal), a level of which is specified for each read operation (e.g., see read compare voltages/levels VrA, VrB, VrC, VrD, VrE, VrF, and VrG, of FIG. 5C) or verify operation (e.g. see verify target voltages/levels VvA, VvB, VvC, VvD, VvE, VvF, and VvG of FIG. 5C) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

FIG. 5D depicts threshold voltage distributions when each memory cell stores four bits of data, which is another example of MLC data. FIG. 5D depicts that there may be some overlap between the threshold voltage distributions (data states) S0-S15. The overlap may occur due to factors such as memory cells losing charge (and hence dropping in threshold voltage). Program disturb can unintentionally increase the threshold voltage of a memory cell. Likewise, read disturb can unintentionally increase the threshold voltage of a memory cell. Over time, the locations of the threshold voltage distributions may change. Such changes can increase the bit error rate, thereby increasing decoding time or even making decoding impossible. Changing the read reference voltages can help to mitigate such effects. Using ECC during the read process can fix errors and ambiguities. Note that in some embodiments, the threshold voltage distributions for a population of memory cells storing four bits of data per memory cell do not overlap and are separated from each other. The threshold voltage distributions of FIG. 5D will include read reference voltages and verify reference voltages, as discussed above.

When using four bits per memory cell, the memory can be programmed using the full sequence programming discussed above, or multi-pass programming processes known in the art. Each threshold voltage distribution (data state) of FIG. 5D corresponds to predetermined values for the set of data bits. The specific relationship between the data programmed into the memory cell and the threshold voltage levels of the cell depends upon the data encoding scheme adopted for the cells. Table 3 provides an example of an encoding scheme for embodiments in which each bit of data of the four bits of data stored in a memory cell are in different logical pages, referred to as a lower page (LP), middle page (MP), an upper page (UP) and top page (TP).

cells on memory die 201. The process includes multiple loops, each of which includes a program phase and a verify phase. The process of FIG. 6 is performed to implement the full sequence programming, as well as other programming schemes including multi-stage programming. When implementing multi-stage programming, the process of FIG. 6 is used to implement any/each stage of the multi-stage programming process.

Typically, the program voltage applied to the control gates (via a selected data word line) during a program operation is applied as a series of program voltage pulses. Between program voltage pulses are a set of verify pulses (e.g., voltage pulses) to perform verification. In many implementations, the magnitude of the program voltage pulses is increased with each successive pulse by a predetermined step size. In step 602 of FIG. 6, the programming voltage signal (Vpgm) is initialized to the starting magnitude (e.g., ~12-16V or another suitable level) and a program counter PC maintained by state machine 262 is initialized at 1. In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 604 the control die will pre-charge channels of NAND strings that include memory cells connected to the selected word line that are to be inhibited from programming. In step 606, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages

TABLE 3

|  | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| TP | 1 | 1 | 1 | 1 | 1 | 0 | 0 | 0 | 0 | 0 | 1 | 1 | 0 | 0 | 0 | 1 |
| UP | 1 | 1 | 0 | 0 | 0 | 0 | 0 | 0 | 1 | 1 | 1 | 1 | 1 | 1 | 0 | 0 |
| MP | 1 | 1 | 1 | 0 | 0 | 0 | 0 | 1 | 1 | 0 | 0 | 0 | 0 | 1 | 1 | 1 |
| LP | 1 | 0 | 0 | 0 | 1 | 1 | 0 | 0 | 0 | 0 | 0 | 1 | 1 | 1 | 1 | 1 |

Figure 6:
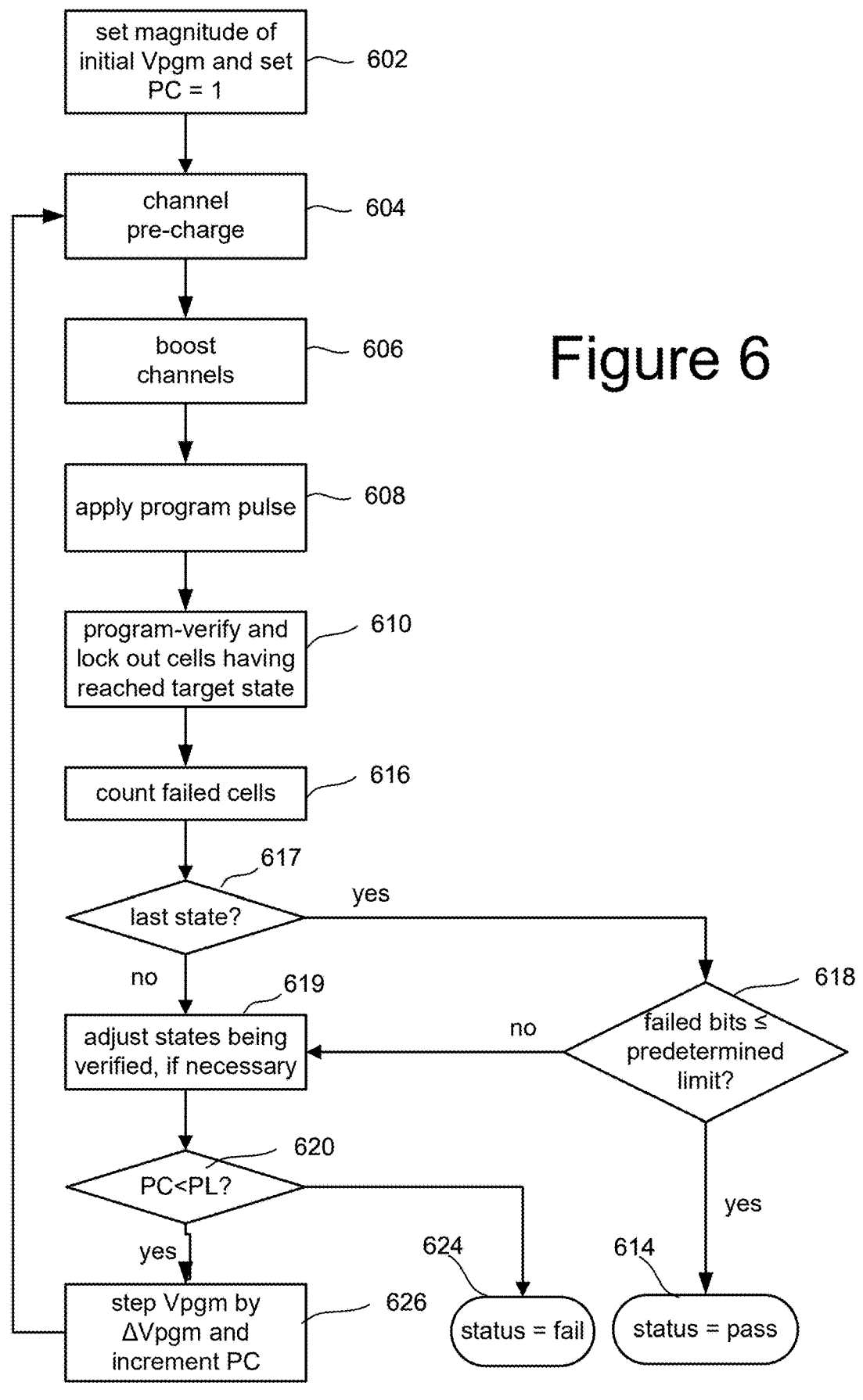
FIG. 6 is a flow chart describing one embodiment of a process for programming non-volatile memory.

FIG. 6 is a flowchart describing one embodiment of a process for programming memory cells. For purposes of this document, the term program and programming are synonymous with write and writing. In one example embodiment, the process of FIG. 6 is performed for memory array 202 using the one or more control circuits (e.g., system control logic 260, column control circuitry 210, row control circuitry 220) discussed above. In one example embodiment, the process of FIG. 6 is performed by integrated memory assembly 207 using the one or more control circuits (e.g., system control logic 260, column control circuitry 210, row control circuitry 220) of control die 211 to program memory (e.g., ~7-11 volts) to perform boosting schemes. A program inhibit voltage is applied to the bit lines coupled the unselected NAND string.

In step 608, a program voltage pulse of the programming voltage signal Vpgm is applied to the selected word line (the word line selected for programming). If a memory cell on a NAND string should be programmed, then the corresponding bit line is biased at a program enable voltage. In step 608, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 610, program-verify is performed, which includes testing whether memory cells being programmed have successfully reached their target data state. Memory cells that have reached their target states are locked out from further programming by the control die. Step 610 includes performing verification of programming by sensing at one or more verify reference levels. In one embodiment, the verification process is performed by testing whether the threshold voltages of the memory cells selected for programming have reached the appropriate verify reference voltage. In step 610, a memory cell may be locked out after the memory cell has been verified (by a test of the Vt) that the memory cell has reached its target state.

In one embodiment of step 610, a smart verify technique is used such that the system only verifies a subset of data states during a program loop (steps 604-626). For example, the first program loop includes verifying for data state A (see FIG. 5C), depending on the result of the verify operation second program loop may perform verify for data states A and B; depending on the result of the verify operation the third program loop may perform verify for data states B and C, and so on.

In step 616, the number of memory cells that have not yet reached their respective target threshold voltage distribution are counted. That is, the number of memory cells that have, so far, failed to reach their target state are counted. This counting can be done by state machine 262, memory controller 120, or another circuit. In one embodiment, there is one total count, which reflects the total number of memory cells currently being programmed that have failed the last verify step. In another embodiment, separate counts are kept for each data state.

In step 617, the system determines whether the verify operation in the latest performance of step 610 included verifying for the last data state (e.g., data state G of FIG. 5C). If so, then in step 618, it is determined whether the count from step 616 is less than or equal to a predetermined limit. In one embodiment, the predetermined limit is the number of bits that can be corrected by error correction codes (ECC) during a read process for the page of memory cells. If the number of failed cells is less than or equal to the predetermined limit, then the programming process can stop and a status of "PASS" is reported in step 614. In this situation, enough memory cells programmed correctly such that the few remaining memory cells that have not been completely programmed can be corrected using ECC during the read process. In some embodiments, the predetermined limit used in step 618 is below the number of bits that can be corrected by error correction codes (ECC) during a read process to allow for future/additional errors. When programming less than all of the memory cells for a page, the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If in step 617 it was determined that the verify operation in the latest performance of step 610 did not include verifying for the last data state or in step 618 it was determined that the number of failed memory cells is not less than the predetermined limit, then in step 619 the data states that will be verified in the next performance of step 610 (in the next program loop) is adjusted as per the smart verify scheme discussed above. In step 620, the program counter PC is checked against the program limit value (PL). Examples of program limit values include 6, 12, 16, 19, 20 and 30; however, other values can be used. If the program counter PC is not less than the program limit value PL, then the program process is considered to have failed and a status of FAIL is reported in step 624. If the program counter PC is less than the program limit value PL, then the process continues at step 626 during which time the Program Counter PC is incremented by 1 and the programming voltage signal Vpgm is stepped up to the next magnitude. For example, the next pulse will have a magnitude greater than the previous pulse by a step size ΔVpgm (e.g., a step size of 0.1-1.0 volts). After step 626, the process continues at step 604 and another program pulse is applied to the selected word line (by the control die) so that another program loop (steps 604-626) of the programming process of FIG. 6 is performed.

In one embodiment memory cells are erased prior to programming. Erasing is the process of changing the threshold voltage of one or more memory cells from a programmed data state to an erased data state. For example, changing the threshold voltage of one or more memory cells from state P to state E of FIG. 5A, from states A/B/C to state E of FIG. 5B, from states A-G to state Er of FIG. 5C or from states S1-S15 to state S0 of FIG. 5D. In one embodiment, the control circuit is configured to program memory cells in the direction from the erased data state toward the highest data state (e.g., from data state Er to data state G) and erase memory cells in the direction from the highest data state toward the erased data state (e.g., from data state G to data state Er).

One technique to erase memory cells in some memory devices is to bias a p-well (or other types of) substrate to a high voltage to charge up a NAND channel. An erase enable voltage (e.g., a low voltage) is applied to control gates of memory cells while the NAND channel is at a high voltage to erase the memory cells. Herein, this is referred to as p-well erase.

Another approach to erasing memory cells is to generate gate induced drain leak ("GIDL") current to charge up the NAND string channel. An erase enable voltage is applied to control gates of the memory cells, while maintaining the NAND string channel potential to erase the memory cells. Herein, this is referred to as GIDL erase. Both p-well erase and GIDL erase may be used to lower the threshold voltage (Vt) of memory cells.

In one embodiment, the GIDL current is generated by causing a drain-to-gate voltage at a GIDL generation transistor (e.g., transistors connected to SGDT0, SGDT1, SGSB0, and SGSB1). In some embodiments, a select gate (e.g., SGD or SGS) can be used as a GIDL generation transistor. A transistor drain-to-gate voltage that generates a GIDL current is referred to herein as a GIDL voltage. The GIDL current may result when the GIDL generation transistor drain voltage is significantly higher than the GIDL generation transistor control gate voltage. GIDL current is a result of carrier generation, i.e., electron-hole pair generation due to band-to-band tunneling and/or trap-assisted generation. In one embodiment, GIDL current may result in one type of carriers (also referred to a charge carriers), e.g., holes, predominantly moving into the NAND channel, thereby raising or changing the potential of the channel. The other type of carriers, e.g., electrons, are extracted from the channel, in the direction of a bit line or in the direction of a source line by an electric field. During erase, the holes may tunnel from the channel to a charge storage region of the memory cells (e.g., to charge trapping layer 493) and recombine with electrons there, to lower the threshold voltage of the memory cells.

The GIDL current may be generated at either end (or both ends) of the NAND string. A first GIDL voltage may be created between two terminals of a GIDL generation transistor (e.g., connected to SGDT0, SGDT1) that is connected to or near a bit line to generate a first GIDL current. A second GIDL voltage may be created between two terminals of a GIDL generation transistor (e.g., SGSB0, SGSB1) that is connected to or near a source line to generate a second GIDL current. Erasing based on GIDL current at only one end of the NAND string is referred to as a one-sided GIDL erase. Erasing based on GIDL current at both ends of the NAND string is referred to as a two-sided GIDL erase. The technology described herein can be used with one-sided GIDL erase and two-sided GIDL erase.

Figure 7:
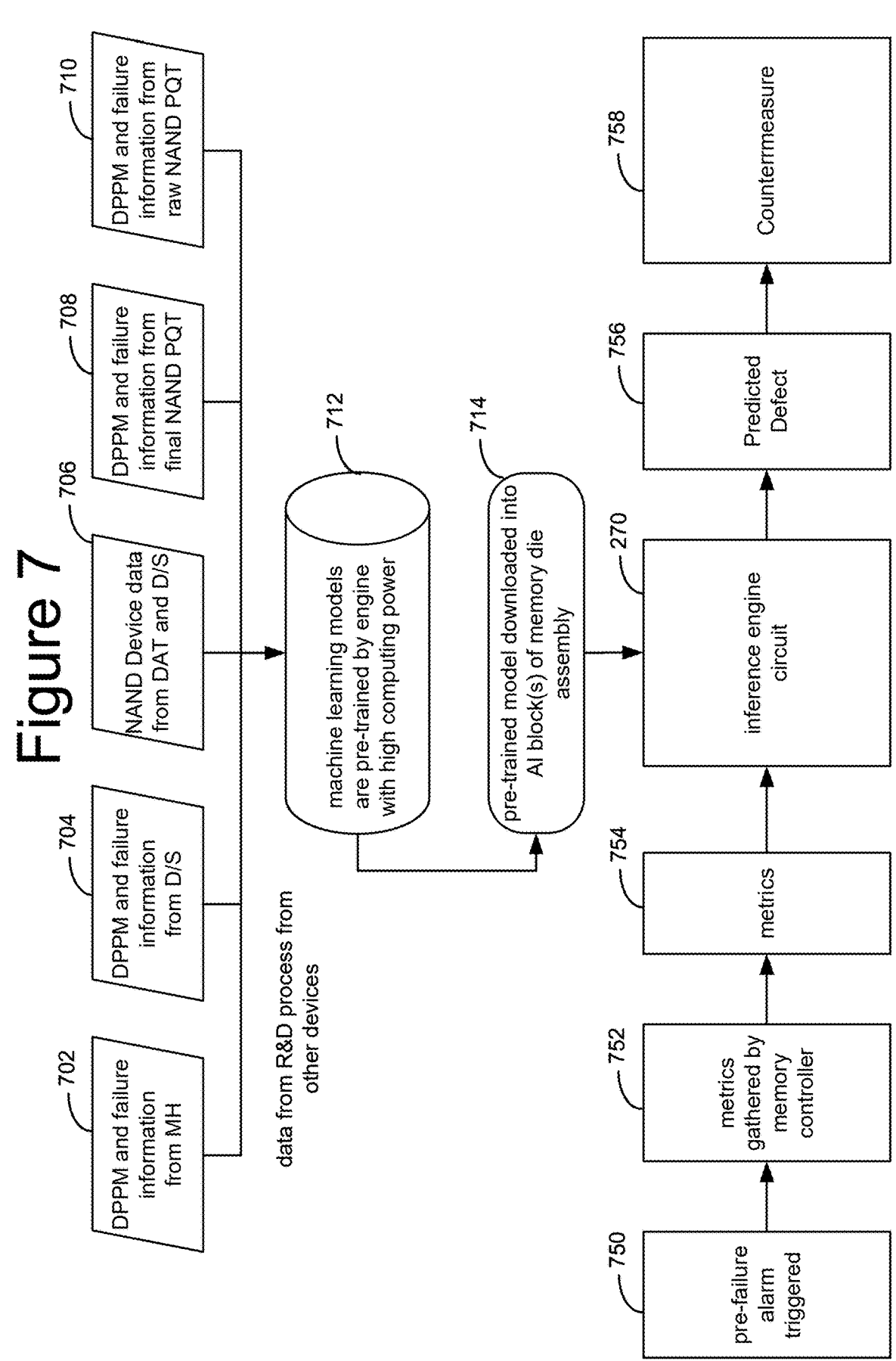
FIG. 7 is a logical block diagram that describes a non-volatile storage apparatus that includes an inference circuit positioned in a memory die assembly, such that the inference circuit is configured to use a pre-trained model with one or more metrics describing current operation of the non-volatile storage apparatus in order to predict whether non-volatile storage will fail.

FIG. 7 is a logical block diagram that describes the use of an inference circuit positioned in a memory die assembly such that the inference circuit is configured to use a pre-trained model with data describing current operation of the non-volatile storage apparatus in order to predict whether the non-volatile memory will fail in the future (e.g., due to a defect). The top portion of FIG. 7 (elements 702-712) represents the ex-situ activity apart from memory die assembly to pre-train the model. Research and Development ("R & D") engineers spend a lot of resources debugging failing chips during the development of a new memory, diagnose the root causes, and then define the countermeasure. The diagnoses are based on symptoms of a failing chip. For example, sometimes a short between neighboring word lines is detected in the memory array (one example of a defect), and it is observed that threshold voltage distribution of these two word lines and adjacent word lines will have specific symptom including leaky current between word lines. The top of FIG. 7 shows five sets of data generated during the R & D process that can be used to train a model: defective parts per million ("DPPM") and failure information from memory health test platform 706, DPPM and failure information from die sort test704, NAND device data from Device Assessment Test ("DAT") 706, DPPM and failure information from final NAND product qualification test ("PQT") 708, and DPPM and failure information from raw NAND product qualification test (PQT) 710. The data 702-710 is used to train a model (or models) using an engine with high computing power (712) and that pre-trained model(s) is downloaded (pre-loaded) into non-volatile memory cells 204 (AI blocks) of memory array 202 (714). In one embodiment, the pre-trained model is/was not trained using data about memory array 202 of storage system 100. Rather, the pre-trained model is received by storage system 100 pre-trained from a source external to storage system 100 (e.g., a R & D, testing and manufacturing environment) based on data from other storage systems/devices.

There are at least two considerations for storing pre-trained models in memory array 202. The first one is for model accuracy, as the higher volume of data inputs for model training results in the higher accuracy of the model. One key advantage is that an R & D process may have a large enough samples size when developing a new technology. Therefore, the large volume of data can result in training a very accurate AI model. A second consideration is that the AI/machine learning models needs a high performance computing engine with high computing power and it may be too expensive to include a high performance computing engine with high computing power inside the memory die assembly. Put another way, it is more cost effective to have the high computing power processor (needed for training a model) outside the memory die assembly rather than inside the memory die assembly.

Memory array 202 can afford to store the model. For example, conventional machine learning models (e.g., decision tree, random forest, XGBOOST, etc.) are typically at the KB level (e.g., using DMAT data, with ~1 GB input, ~300 parameters, the trained model is ~300 KB). Even for deep neural network model, the corresponding model size is ~ 100 MB level according to model depth & input size. This amount of data can fit within one block of memory array 202.

The bottom portion of FIG. 7 (elements 750-756) represents the on-the-fly diagnostics, which is based on machine learning (AI). There are different types of machine learning, such as neural networks, decision trees, support-vector machines, regression analysis, Bayesian networks, genetic algorithms, random forests, etc. The technology described herein is generic to and can be implemented with the different types of machine learning and is not specific to any one type of machine learning/AI. When certain conditions occur, a pre-failure alarm is triggered to memory control 120 (750). Examples of pre-failure alarms are unusual number of program loops (e.g., steps 604-626); unusual amount of erase voltages (e.g., pulses) needed to complete erasing; large failed bit count from programming, erasing and/or reading; and unexpected change in program voltage Vpgm, erase voltage, power supply voltage, pass voltages, reference voltages, control voltages, etc. Other conditions can also trigger the pre-failure alarm. In some embodiments, the pre-failure alarm is triggered when an unusual condition exists but before there is a known defect and before there is a non-recoverable failure in the non-volatile storage apparatus due to the defect.

In response to the known defect, memory controller 120 gathers (752) one or more metrics (754) describing current operation of the storage system 100 in order to predict a future/potential defect in the storage system 100 before there is a non-recoverable failure in the storage system 100 due to the defect. Examples of metrics include data word line threshold voltage distribution, Non-data word line threshold voltage distribution, failed bit count ("FBC"); word line RC value, bit line RC value, Bitmap, miscellaneous leaky measurements (e.g., leaky analog current or leaky digital DAC between word lines, leaky analog current or leaky digital DAC between bit lines, leaky analog current or leaky digital DAC between WL and channels), bad columns count, bad block count, Iccs (standby current), values of various control signals, program disturb, read disturb, data retention issues. Natural Vth (measure Vth width after program operation without verify), program noise, read noise, program speed, erase speed, vboost, verify noise, Neighbor word line disturb, Icell, VSGD margin, Vpass margin, SENSE-Natural-Vt, DIBL, and cross temperature Vt budget. Other metrics can also be gathered.

The metrics 754 are provided to inference circuit 270, which uses the metrics (all or a subset) with the pre-trained model to predict a future/potential defect/failure (predicted defect 756) in the storage system 100. Examples of die level defects/failures include leaky pumps, leaky cgi, defective latches, defective sense amplifiers, nonlinear DACs, row driver open/short, and column drive open/short. Examples of block level defects/failures include WL-WL short, WL-MH short, WL-DMH short, WL-LI short, SGD Leak, SGS Leak, SGSB Leak, BLKSEL Leak, SGD Downshift, SGD Upshift, slow to program and slow to erase. Other defects/failures can also be predicted. The technology described herein is not limited to the metrics and defects listed above, and can be used for other metrics and/or defects.

The predicted defect(s) is used to (optionally) perform one or more countermeasures to preserve the host data prior to a non-recoverable failure in the non-volatile storage apparatus due to the defect (758).

Figure 8:
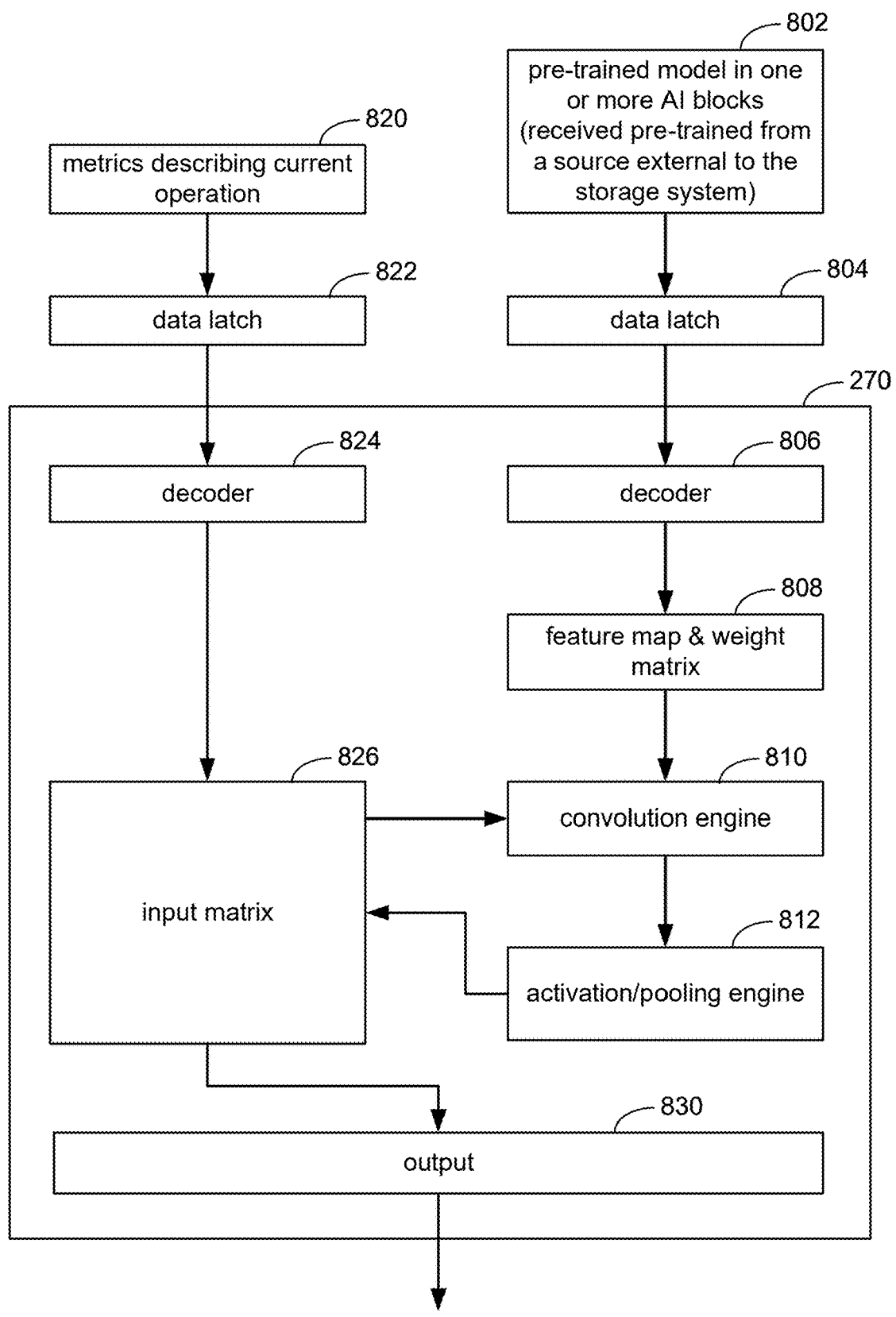
FIG. 8 is a block diagram of one embodiment of an inference engine.

FIG. 8 is a block diagram of one embodiment of an inference circuit 270. As depicted, inference circuit 270 receives two sets of inputs: pre-trained model 802 in one or more AI blocks (received pre-trained from a source external to the storage system) of memory array 202 and one or more metrics 820 describing current operation of the storage system (including memory array 202). Examples of the one or more metrics 820 include output data (also referred to as operational data) from the leak tests described below. The pre-trained model 802 is read from one or more AI blocks of memory array 202 and stored in a data latch 804 or other storage unit, where the model is provided to a decoder 806 that puts the data representing the model in an expected format for a feature map and weight matrix 808. The features and weights are provided to a convolution engine 810 which is known in the art as an example of a convolutional neural network (however, other machine learning technologies can also be used in addition to or instead of).

The one or more metrics are provided by memory controller 120 or state machine 262 and stored in a data latch 822, where the metrics are provided to a decoder 824 that puts the data representing the metrics in an expected format for input matrix 826. As depicted, input matrix 826 provides the one or more metrics to convolution engine 810. Based on the one or more metrics and the pre-trained model, convolution engine 810 computes one or more inferences, the output of which is provided to activation/pooling engine 812. Pooling is a form of non-linear down-sampling. There are several non-linear functions that can suitably implement pooling (e.g., max pooling). In one embodiment, an activation function effectively removes negative values by setting them to zero (or another value). Activation introduces non-linearities to the decision function and in the overall network without affecting the receptive fields of the convolution layers. The output of activation/pooling engine 812 updates the input matrix 826. Over one or more iterations, one or more inferences are generated and outputted from input matrix 826 to an output register 830. In one embodiment, inference engine 270 (including output register 830) communicates with state machine 262 and memory controller 120 to report potential defects/failures and take countermeasures.

One set of tests that can be used with inference circuit 270 to predict issues with non-volatile memory include leak tests. FIG. 9 is a flow chart describing one embodiment of a process for performing leak tests integrated into a pre-erase process for a set of non-volatile memory cells in order to predict whether the set of non-volatile memory cells will fail using inference engine 270 and the pre-trained model. In one embodiment, the process of FIG. 9 can be performed by any one of the one or more control circuits discussed above. The process of FIG. 9 can be performed entirely by a control circuit on memory die 200 (see FIG. 2A) or entirely by a control circuit on integrated memory assembly 207 (see FIG. 2B), rather than by memory controller 120. In one example, the process of FIG. 9 is performed by or at the direction of state machine 262, using other components of System Control Logic 260 (including Inference Circuit 270), Column Control Circuitry 210 and Row Control Circuitry 220. In another embodiment, the process of FIG. 9 is performed by or at the direction of memory controller 120. The process of FIG. 9 can be performed on a memory implementing any of the structures depicted in FIG. 1-4F, or other memory structures.

In step 880 of FIG. 9, the control circuit performs multiple leak tests for the signal lines connected to a set of non-volatile memory cells such that the multiple leak tests are integrated into a pre-erase process for the set of non-volatile memory cells after the set of non-volatile memory cells have received programming. Examples of signal lines include word lines, select lines (e.g., SGD, SGDT, SGS, SGSB), source lines and bit lines. A non-exhaustive list of examples of leaks test that are performed in one embodiment of step 880 include testing for leaks between neighboring word lines, testing for leaks between word lines and memory holes, testing for leaks between word lines and line interconnects LI (see FIG. 4B), testing for leaks between drain side select lines (e.g., SGD and SGDT) and nearby structures (e.g., word lines, other selection lines, line interconnects, memory holes, etc.) and testing for leaks between source side select lines (e.g., SGS and SGDSB) and nearby structures (e.g., word lines, other selection lines, line interconnects, memory holes, etc.). In other embodiments, additional leak tests can be performed or only a subset of the above-listed leak tests are performed.

In step 882, the inference circuit uses results of the leak tests of step 880 with a pre-trained model (e.g., pre-trained model 802 stored in AI blocks 204 or stored elsewhere in the memory system) to predict whether the set of non-volatile memory cells will fail. That is, the set of non-volatile memory cells has not necessarily failed yet, but due to the results of the multiple leak tests, inference circuit 270 predicts whether the set of non-volatile memory cells are likely to fail or not fail in the future. In one embodiment, the set of non-volatile memory cells is a block of memory cells.

In one embodiment, the results of the leak tests of step 880 includes operational data, which is data sensed about and/or during the operation of the memory and includes information other than a binary indicator of whether any particular leak test failed. That is, inference circuit 270 makes its prediction of whether the set of non-volatile memory cells will fail or not fail in the future based on operational data rather than a set of pass/fail indications from the various leak tests. In one embodiment, the operation data that is the result of a given leak test may include a measurement of a current of voltage. For example, when testing whether a first word line leaks to a second word line, the operational data that is the result or output of the leak test can include a current and/or voltage measured for the first word line and/or the second word line. In such an embodiment, inference circuit 270 will make its prediction of whether the set of non-volatile memory cells will fail or not fail in the future based on a set of currents and/or voltages measured during the leak tests. In one embodiment, the control circuit includes a charge pump configured to generate a voltage for one or more of the leak tests and a current mirror in communication with the charge pump such that the operational data used by inference circuit 270 to make its prediction comprises measurements of current from the current mirror. In another embodiment, the control circuit includes a charge pump configured to generate a test voltage for one or more of the leak tests and a counter to count clock cycles needed to drive the test voltage such that the operational data used by inference circuit 270 to make its prediction comprises a number of clock cycles counted that are needed to drive the test voltage to its target magnitude. Other examples of operational data can also be implemented.

In step 884, the control circuit performs an erase process on the set of non-volatile memory cells while the inference circuit 270 uses results of the leak tests with the pre-trained model to predict whether the first set of non-volatile memory cells will fail. The erase process of step 884 can be any erase process known in the art. In one example, a one sided or two sided GIDL based erase process is used, as described above. In one embodiment, step 884 is performed concurrently with step 882.

In step 886, the control circuit prevents the set of non-volatile memory cells from further storage of valid data if inference circuit 270 predicts that the first set of non-volatile memory cells will fail or the erase process fails. In step 888, control circuit allows the first set of non-volatile memory cells to store future valid data if inference circuit 270 predicts that the first set of non-volatile memory cells will not fail and the erase process succeeds.

Figure 10:
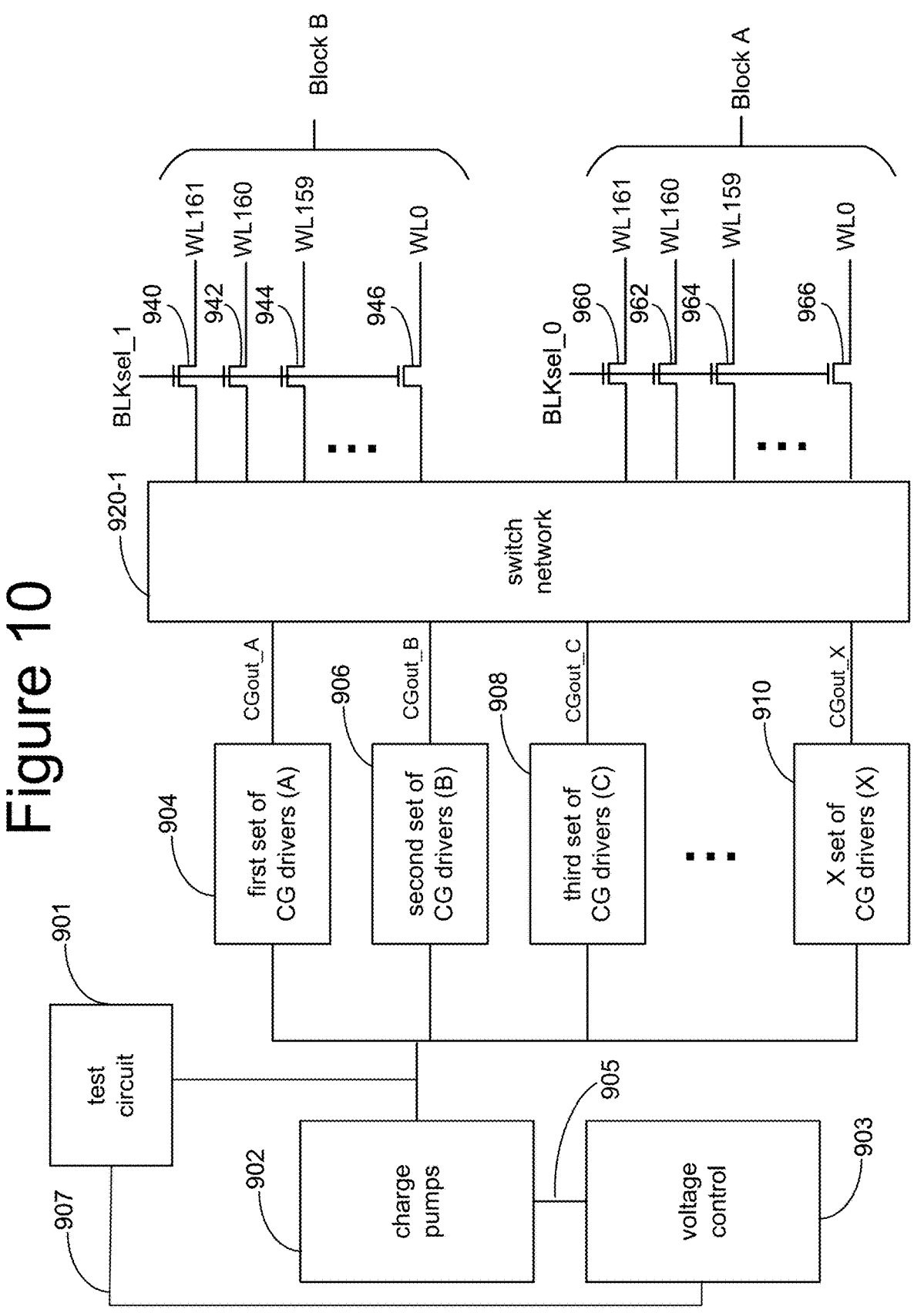
FIG. 10 is a block diagram describing one embodiment of a system for supplying voltages to word lines.

The programming, verifying/sensing and erasing processes discussed above require that various voltages be applied to the word lines of the selected block(s) of memory cells. FIG. 10 is a block diagram that depicts charge pumps, control gate drivers, a switch network, and word line switches that are used to apply those voltages to the word lines. FIG. 10 shows a set of charge pumps 902 providing multiple different sources of voltages to multiple sets of control gate drivers including a first set of control gate drivers 904, a second set of control gate drivers 906, a third set of control gate drivers 908, . . . a X set of control gate drivers 910. Charge pumps 902 include multiple charge pumps that supply the different voltages needed to perform memory operations. In some embodiments, voltage generators can also generate some of the different voltages needed to perform memory operations. In one embodiment, there is a separate set of one or more charge pumps or voltage generator for each voltage needed to be applied to the word lines. In other embodiments, some charge pumps and/or voltage generators can be the source of multiple voltages by using voltage dividers or other circuits.

In one embodiment, first set of control gate drivers 904 includes multiple control gate drivers for supplying the necessary voltages to data word lines (e.g., WL0-WL161) in order to perform programming, erasing and reading. The output of the first set of control gate drivers 904, CGout_A (which includes one separate output signal for each control gate driver) is provided (connected) to switch network 920-1. First set of control gate drivers 904 are connected to the data word lines via switch network 920-1. In one embodiment, all of the control gate drivers of the first set of control gate drivers 904 have the same structure, receive the same inputs (source of voltage) and provide the same set of voltage outputs.

In one embodiment, second set of control gate drivers 906 includes multiple control gate drivers for supplying the necessary voltages to dummy word lines in order to perform programming, erasing and reading. The output of the second set of control gate drivers 906, CGout_B (which includes one separate output signal for each control gate driver) is provided (connected) to switch network 920-1. The second set of control gate drivers 906 are connected to the dummy word lines via switch network 920-1. In one embodiment, all of the control gate drivers of the second set of control gate drivers 906 have the same structure, receive the same inputs (sources of voltage) and provide the same set of voltage outputs.

In one embodiment, third set of control gate drivers 908 includes multiple control gate drivers for supplying the necessary voltages to select lines (e.g., SGD and SGS) in order to perform programming, erasing and reading. The output of the third set of control gate drivers 908, CGout_C (which includes one separate output signal for each control gate driver) is provided (connected) to switch network 920-1. The third set of control gate drivers 908 are connected to the select lines via switch network 920-1. In one embodiment, all of the control gate drivers of the third set of control gate drivers 908 have the same structure, receive the same inputs (sources of voltage) and provide the same set of voltage outputs.

FIG. 10 shows word lines WL0-WL161 for two example blocks (Block A and Block B). Each word line WL0-WL161 for each block is connected to an output of switch network 920-1 via a word line switch transistor (e.g., 940-966). For example, word line WL0 of block A is connected to the output of word line switch transistor 966, WL159 of block A is connected to the output of word line switch transistor 964, WL160 of block A is connected to the output of word line switch transistor 962, WL161 of block A is connected to the output of word line switch transistor 960, WL0 of block B is connected to the output of word line switch transistor 946, WL159 of block B is connected to the output of word line switch transistor 944, WL160 of block B is connected to the output of word line switch transistor 942, and WL161 of block 1 is connected to the output of word line switch transistor 960. The inputs to the word line switches are connected to outputs of switch network 920. In one embodiment, switch network 920 includes a plurality of high voltage switches (e.g., transistors) to connect the control gate drivers to the appropriate word lines by routing the output voltage from the control gate drivers to the appropriate word line switch transistors 940-966 connected to the word lines WL0-WL161 of each block. Note that in some embodiments, multiple word lines can share a single control gate driver. The switch network is also connected to the select lines SGS and SGD (which are omitted from FIG. 10 to make FIG. 10 easier to read).

FIG. 10 also depicts voltage control circuit 903, which is connected to charge pumps 902 (via signals 905) and testing circuit 901 (via signals 907). Voltage control circuit 903 (which is part of one embodiment of the control circuit discussed above) controls the output of charge pumps 902. In one embodiment, voltage control circuit 903 receives a digital signal from the state machine or other processor that indicates the desired charge pump output, and voltage control circuit 903 includes a digital to analog conversion circuit that outputs signal 905 to charge pumps 902 that indicates the requested voltage signal to be output by the charge pumps. Testing circuit 901 (which is part of one embodiment of the control circuit discussed above), which is connected to the output of charge pumps 902 and is an input of voltage control 903, is configured to test the current and/or voltage on the output line of the charge pumps and provide a control signal to voltage control 903 and/or state machine 262.

In one embodiment, test circuit 901 includes the current mirror discussed above that can be used to sense the amount of current being driven on a word line or set of word lines. The current mirror can be connected to a digital to analog converter to provide a digital output. For example, when charge pumps are being used to drive a voltage on a set of one or more word lines, the current mirror can be used to monitor the magnitude of the current in the word lines.

In another embodiment, test circuit 901 includes a voltage detector to detect when a voltage driven on a word line (or other signal line) has reached its target. Test circuit 901 can also include a counter that counts clock cycles that passed from the start of applying a voltage until the time that the voltage driven on a word line (or other signal line) has reached its target magnitude, such that the count can be provided to voltage control 903 and/or state machine 262. Other examples of test circuits can also be used as circuits that sense the magnitude of current and/or voltage are well known in the art and many different circuits can be used.

Figure 11:
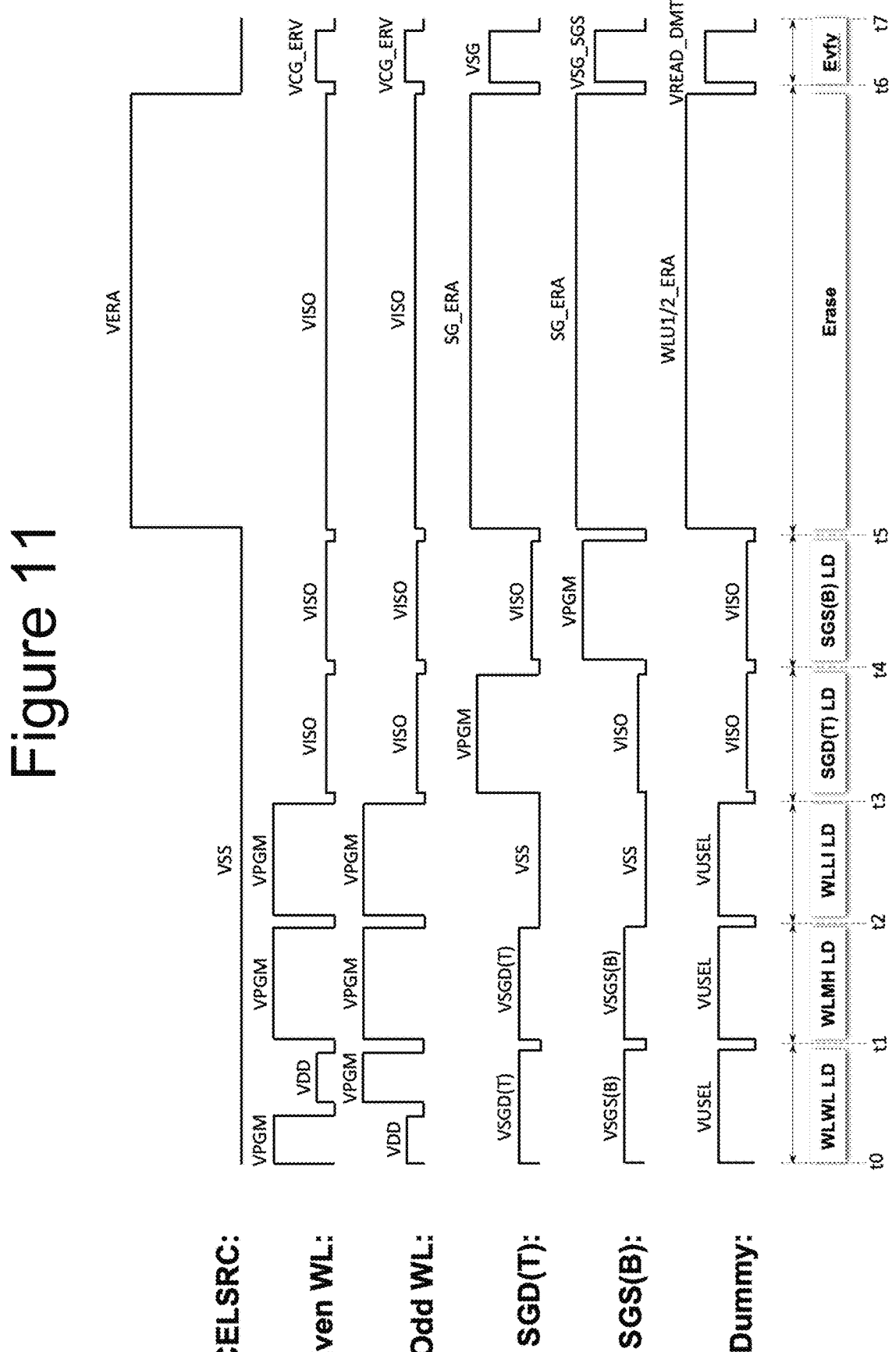
FIG. 11 is a timing diagram depicting the behavior of various signals during multiple leak test that are integrated into a pre-erase process for a set of non-volatile memory cells.

FIG. 11 is a timing diagram depicting the behavior of various signals during multiple leak tests that are integrated into a pre-erase process for a set of non-volatile memory cells. FIG. 11 depicts the following six signals: CELSRC, Even WL, Odd WL, SGD(T), SGS(B) and Dummy. The signal CELSRC represents the voltage on the source line SL (see FIGS. 4C and 4F) for a block of memory cells. The signal Even WL represents the voltage on even numbered word lines, such as WL0, WL2, WL4, WL6, . . . . WL160 (see FIGS. 4C and 4F). The signal Odd WL represents the voltage on odd numbered word lines, such as WL1, WL3, WL5, WL7, . . . . WL161 (see FIGS. 4C and 4F). The signal SGD(T) represents the voltage on drain side select lines, such as (for example) SGDT0, SGDT1, SGD0 and SGD1 (see FIGS. 4C and 4F). The signal SGS(B) represents the voltage on source side select lines, such as (for example) SGSB0, SGSB1, SGDS0 and SGDS1 (see FIGS. 4C and 4F). The signal Dummy represent the voltage on the dummy word lines, such as (for example) DS0, DS1, DD0, DD1, DU and DL (see FIGS. 4C and 4F).

Between time t0 and time t5, one embodiment of five leak tests are performed for a block of non-volatile memory cells, representing an example implementation of step 880 of FIG. 9. Between time t5 and time t7, one embodiment of an erase process is performed for the set of non-volatile memory cells, representing an example implementation of step 884 of FIG. 9.

Between time t0 and time t1 is a first leak test, for word line to word line leaks (word line to word line leak detection WLWL LD). In the word line to word line leak detection test, first even word lines are tested followed by odd word lines being tested (the order can be reversed). The even word lines are tested by applying VPGM (e.g., 16-20v) to even word lines Even WL, VDD (e.g., ~1.5v) to odd word lines Odd WL, VSS (e.g., ground or 0v) to CELSRC, VSGD(T) [e.g., ~5v] to VSGD(T), VSGS(B) [e.g., ~5v] to SGS(B) and VUSEL (e.g., ~7-10v) to Dummy, and then the current is sensed at the signal line providing VPGM to the even word lines (e.g., a current mirror in test circuit 901 connected to charge pumps 902 or counting the number of clock cycle to reach the target magnitude for VPGM). The odd word lines are tested by applying VPGM to odd word lines Odd WL, VDD to even word lines Even WL, VSS to CELSRC, VSGD(T) to VSGD(T), VSGS(B) to SGS(B) and VUSEL (e.g., ~7-10v) to Dummy, and the current is sensed at the signal line providing VPGM to the odd word lines (e.g., a current mirror in test circuit 901 connected to charge pumps 902 or counting the number of clock cycle to reach the target magnitude for VPGM).

Between time t1 and time t2 is a second leak test, for word line to memory hole leaks (WLMH LD). VSS is applied to CELSRC, VPGM is applied to all data word lines (Even WL and Odd WL), VSGD(T) is applied to SGD(T), VSGS(B) is applied to SGS(B) and VUSEL is applied to DUMMY, and the current is sensed at the signal line providing VPGM to the even word lines Even WL and the odd word lines Odd WL (e.g., a current mirror in test circuit 901 connected to charge pumps 902 or counting the number of clock cycle to reach the target magnitude for VPGM).

Between time t2 and time t3 is a third leak test, for word line leaks to line interconnects LI (see e.g., FIG. 4B) (WLLI LD). VSS is applied to CELSRC, VPGM is applied to all data word lines (Even WL and Odd WL), VSS is applied to SGD(T) and SGS(B) and VUSEL is applied to DUMMY, and the current is sensed at the signal line providing VPGM to the even word lines Even WL and the odd word lines Odd WL (e.g., a current mirror in test circuit 901 connected to charge pumps 902 or counting the number of clock cycle to reach the target magnitude for VPGM).

Between time t3 and time t4 is a fourth leak test, for drain side select lines leaks to any structure nearby (e.g., neighbor drain side select lines, word lines, LI, memory holes, etc.) [SGD(T) LD]. VSS is applied to CELSRC, VISO (e.g., ~1v) is applied to all data word lines (Even WL and Odd WL), VPGM is applied to SGD(T), VISO is applied to SGS(B), and VISO is applied to DUMMY, and the current is sensed at the signal line providing VPGM to the drain side select lines SGD(T) (e.g., a current mirror in test circuit 901 connected to charge pumps 902 or counting the number of clock cycle to reach the target magnitude for VPGM).

Between time t4 and time t5 is a fifth leak test, for source side select lines leaks to any structure nearby (e.g., neighbor source side select lines, word lines, LI, memory holes, etc.) [SGS(B) LD]. VSS is applied to CELSRC, VISO (e.g., ~1v) is applied to all data word lines (Even WL and Odd WL), VPGM is applied to SGS(B), VISO is applied to SGD(T), and VISO is applied to DUMMY, and the current is sensed at the signal line providing VPGM to the source side select lines SGS(B) (e.g., a current mirror in test circuit 901 connected to charge pumps 902 or counting the number of clock cycle to reach the target magnitude for VPGM).

Other embodiments can have additional leak tests. Other embodiments can have a subset of the five leak tests depicted in FIG. 11. The leak test (the five leak tests from t0-t5) are integrated into a pre-erase process for a set of non-volatile memory cells. The main portion of that erase process starts at time t5. Between t5 and t6 an erase voltage pulse is applied to the cell source line CELSRC (and, in some embodiments, the bit lines). The erase voltage pulse is provided on CELSRC with magnitude of VERA (e.g., ~16-25v). Providing the erase voltage pulse also comprises applying VISO to all data word lines (Even WL and Odd WL), SG_ERA (e.g., ~12v) to SGD(T) and SGS(B), and WLU1/2_ERA (e.g., ~12v) to DUMMY.

Between time t6 and time t7 erase verify is performed. For example, in regard to the embodiment of FIG. 5C, the control circuit tests whether all memory cells have threshold voltages below Vev so that they are in the erased data state Er. The example erase verify operation comprises applying VSS to CELSRC, VCG_ERV (e.g., Vev) to all data word lines (Even WL and Odd WL), VSG (e.g., ~5v) to SGD(T), VSG_SGS (e.g., ~5v) to SGS(B), and VEAD_DMT (e.g., ~5v) to DUMMY.

FIG. 11 shows one erase voltage pulse and one erase verify operation; however, some embodiments can include applying one or more erase voltage pulses and performing erase verify after multiple (e.g., at least a subset of) erase voltage pulses.

FIG. 11 shows an example that includes five different leak tests performed as part of step 880 of FIG. 9. In one embodiment, each of the leak tests can be independently enabled and disabled by the control circuit and inference circuit 270 is configured to use results of whichever leak tests are enabled to predict whether the first set of non-volatile memory cells will fail.

Figure 12:
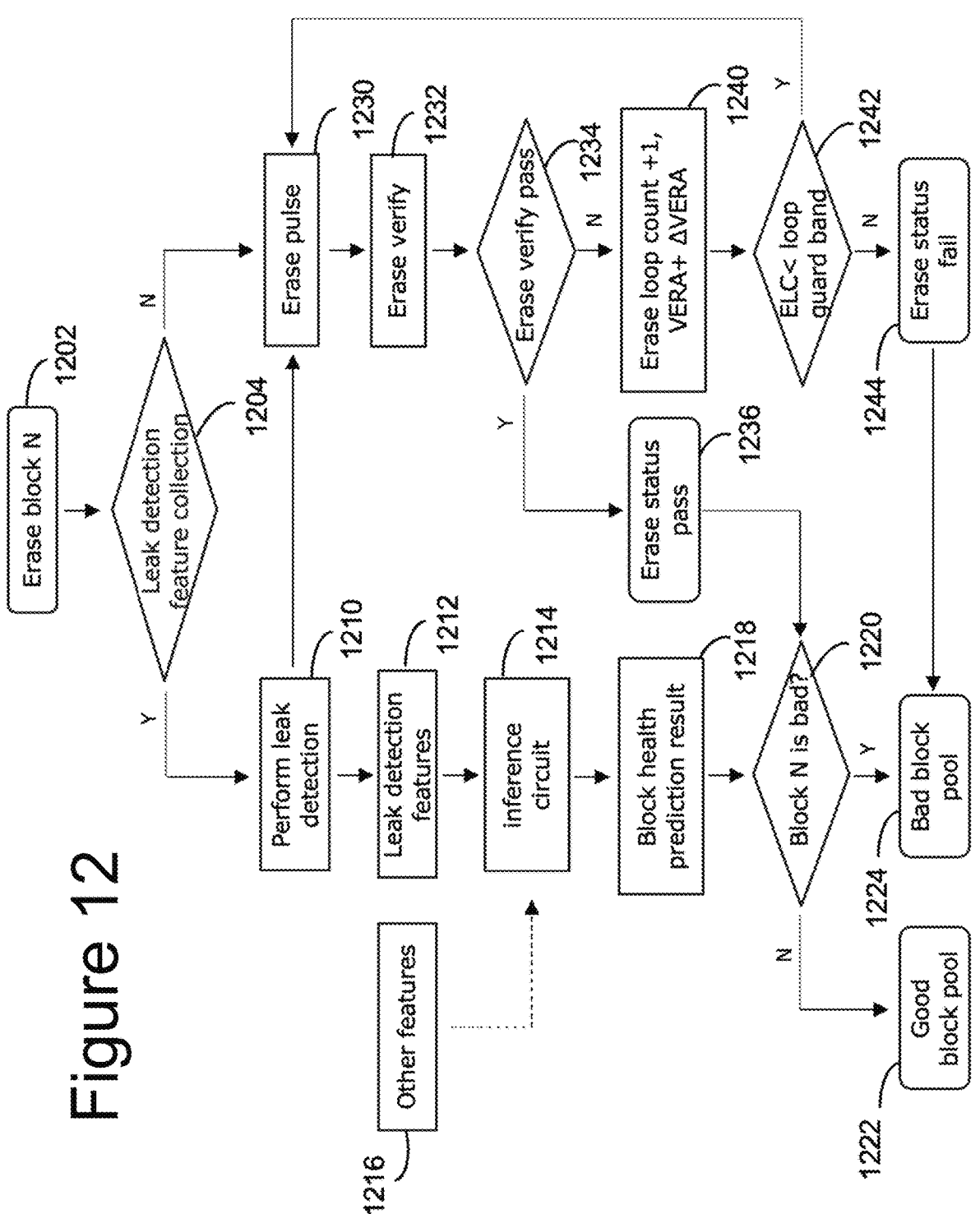
FIG. 12 is a flow chart describing one embodiment of a process for performing leak test integrated into a pre-erase process for a set of non-volatile memory cells in order to predict whether the set of non-volatile memory cells will fail.

FIG. 12 is a flow chart describing one embodiment of a process for performing leak tests integrated into a pre-erase process for a set of non-volatile memory cells in order to predict whether the set of non-volatile memory cells will fail using inference engine 270. The leak tests are integrated into the pre-erase process because they are performed when the erase process is performed, just prior to erasing. The process of FIG. 12 is an example implementation of the process of FIG. 9. The process of FIG. 12 can be performed entirely by a control circuit on memory die 200 (see FIG. 2A) or entirely by a control circuit on integrated memory assembly 207 (see FIG. 2B), rather than by memory controller 120. In one example, the process of FIG. 12 is performed by or at the direction of state machine 262, using other components of System Control Logic 260 (including Inference Circuit 270), Column Control Circuitry 210 and Row Control Circuitry 220. In another embodiment, the process of FIG. 12 is performed by or at the direction of memory controller 120. The process of FIG. 12 can be performed on a memory implementing any of the structures depicted in FIG. 1-4F, or other memory structures.

In step 1202 of FIG. 12, block N is selected to be erased. In one example, when a block is no longer is storing valid data, it is marked as invalid, and the memory system uses a garbage collection processes to clean up the block with invalid data such that the garbage collection process will erase the block and put that block in the Good Block Pool. The Good Block Pool is a set of blocks that are completely erased and ready to be programmed. Thus, one embodiment of step 1202 includes a garbage collection process selecting to erased block N. In other embodiments, block N can be selected to erase for another reasons. In some embodiments, the garbage collection process is performed while the non-volatile storage system is idle (not performing commands from the host or user); therefore, the erasing and leak detection test performed herein are then performed while the non-volatile storage system is idle. In some embodiments, the erasing and the decision to erase are unrelated to garbage collection.

In step 1204, the control circuit determines whether to perform leak detection feature collection. For purposes of this document, leak detection feature collection is the performing of leak tests (e.g., such as the test of FIG. 11) to generate output data (e.g., operational data discussed above). In some embodiments, the leak tests are performed for a block every time the block is erased. In other embodiments, the leak tests are performed after a certain number of program/erase cycles (e.g., every 2 cycles, 10 cycles, 50 cycles, etc.). For purposes of this document, a program/erase cycle is a block being programmed and subsequently erased at some time after being programmed. Thus, in some embodiments, the leak tests are performed before (e.g., integrated into a pre-erase process) a subset of erase processes.

If (in step 1204) the control circuit determines that it is time to perform leak detection feature collection, then in step 1210, one or more leak tests are performed (e.g., analogous to step 880 of FIG. 9). One example implementation of step 1210 is depicted in FIG. 11 at times t0-t5. The output data (e.g., operational data discussed above) from the leak tests of step 1210 is depicted in FIG. 12 as leak detection features 1212 which is/are provided to inference circuit 270 is step 1214. Inference circuit 270 can (optionally) receive other data/features 1216 from other tests or other sensed information about the memory. Based on leak detection features

1212, (optionally) other data/features 1216 and the pre-trained model, inference circuit 270 provides a block health prediction result 1218, which predicts whether block N is likely fail at some time in the future. If inference circuit 270 predicts that block N is likely fail at some time in the future, then block N is considered a bad block (step 1224) and placed in the Bad Block Pool in step 1224. In one embodiment, the Bad Block Pool is a list of blocks that the system will no longer use to store valid data. Adding a block to the Bad Block Pool is one example of preventing a block from further storage of valid data (see step 886 of FIG. 9).

After performing the leak test of step 1210, the control circuit will also start an erase process for block N at step 1230. Also, if in step 1204 it was determined that it is not time for leak detection test to be performed for block N, then the process skips the leak tests and starts the erase process for block N at step 1230. The erase process comprises applying an erase voltage pulse (see e.g., VERA applied to CELSR at t5-t6 of FIG. 11) at step 1230 followed by erase verify in step 1232 (see e.g. t6-t7 of FIG. 11). If the erase verify process does not pass (e.g., because not enough memory cells are in the erased data state), then the loop count is incremented by 1 and the magnitude of the erase voltage pulse (VERA) is increased (e.g., by AVERA) in step 1240. Examples of AVERA are between 0.1-0.5v. The control circuit also determines whether the maximum number of erase pulses have already been applied by keeping track of the number of loops of steps 1230-1242 that have been performed (ELC) and making sure that ELC is less than a maximum (ELC<loop guard band) in step 1242. Examples of the "loop guard band" are between 1-6. If the maximum number of erase pulses have already been applied, then in step 1244 the erase process has failed, the erase status is set as "Fail" and block N is placed in the Bad Block Pool in step 1224. In this manner, block N is added to the Bad Block Pool in response to the inference circuit 270 predicting that the block will fail or the erase process failing. If the maximum number of erase pulses has not already been applied, then the process continues at step 1230 to perform another loop. In this manner, multiple erase voltage pulses are applied until the erase process completes successfully or fails.

The erase process of steps 1230-1242 is performed concurrently with the inference circuit 270 determining its prediction of whether block N will fail in steps 1214-1216.

If the erase verify process passes (step 1234), then the erase process is marked with a status of "Pass" and the process continues at step 1220. If (step 1220) inference circuit 270 predicts that block N will not fail and the erase process is marked with a status of "Pass" (erase process succeeded) then block N is placed in the Good Block Pool in step 1222. For purposes of this document, the Good Block Pool is a list of blocks that are erased and ready to store new data. Placing a block in the Good Block Pool is an example of allowing the block of non-volatile memory cells to store valid user data in response to determining that the erase process passed and the inference engine predicting that the block of non-volatile memory cells will not fail.

A non-volatile memory has been proposed that uses leaks tests with machine learning to detect whether a non-volatile memory will fail. Previous memory systems run tests in the factory. However, long tests add significant costs and delays to the development and manufacturing of the memory. Additionally, conditions could change such that a memory system that passed tests in the factory develops an issue in the field. The use of leaks tests with machine learning to detect whether a non-volatile memory will fail can be used in the field to predict an issue before it happens so that data being stored is not lost. Additionally, most prior art tests are single feature tests (e.g. test for one type of defect), which limits the ability to identify a problem, while the proposal herein uses a combination of tests to improve the ability to accurately predict an issue.

One embodiment incudes a non-volatile storage apparatus, comprising: a non-volatile memory structure comprising a first set of non-volatile memory cells and signal lines connected to the first set of non-volatile memory cells; and a control circuit connected to the non-volatile memory structure and configured to program and erase the first set of non-volatile memory cells, the control circuit comprises an inference circuit, the control circuit is configured to perform multiple leak tests for the signal lines, the multiple leak tests are integrated into a pre-erase process for the first set of non-volatile memory cells after the first set of non-volatile memory cells have received programming, the inference circuit is configured to use results of the leak tests with a model to predict whether the first set of non-volatile memory cells will fail.

In one example implementation, the control circuit is further configured to perform a countermeasure to prevent loss of data prior to a failure in the first set of non-volatile memory cells if the inference circuit predicts that the first set of non-volatile memory cells will fail.

In one example implementation, the control circuit is further configured to prevent the first set of non-volatile memory cells from further storage of valid data if the inference circuit predicts that the first set of non-volatile memory cells will fail.

In one example implementation, the model is a pre-trained model received pre-trained from a source external to the non-volatile storage apparatus; and the model is stored in the non-volatile memory structure.

In one example implementation, the control circuit is configured to perform an erase process on the first set of non-volatile memory cells while the inference circuit uses results of the leak tests with the model to predict whether the first set of non-volatile memory cells will fail.

In one example implementation, the control circuit is further configured to prevent the first set of non-volatile memory cells from further storage of valid data if the inference circuit predicts that the first set of non-volatile memory cells will fail or the erase process fails.

In one example implementation, the control circuit is further configured to allow the first set of non-volatile memory cells to store future valid data if the inference circuit predicts that the first set of non-volatile memory cells will not fail and the erase process succeeds.

In one example implementation, the control circuit is configured to independently enable and disable any of the multiple leak tests; and the inference circuit is configured to use results of whichever leak tests are enabled to predict whether the first set of non-volatile memory cells will fail.

In one example implementation, the control circuit is configured to perform multiple erase processes on the first set of non-volatile memory cells; and the control circuit is configured to perform the multiple leak tests before only a subset of the erase processes.

In one example implementation, the results of the leaks tests include operational data measured during each of the leak tests; the inference engine is configured to use the operational data to predict whether the first set of non-volatile memory cells will fail; and the control circuit is configured to: while the inference engine is using the operational data to predict whether the first set of non-volatile memory cells will fail, perform an erase process including applying one or more erase voltage pulses to the first set of non-volatile memory cells and performing erase verify after at least a subset of the erase voltage pulses until the erase process is determined to have passed or failed, allow the first set of non-volatile memory cells to store valid user data in response to determining that the erase process passed and the inference engine predicting that the first set of non-volatile memory cells will not fail; and prevent the first set of non-volatile memory cells from storing valid user data in response to determining that the erase process failed or the inference engine predicting that the first set of non-volatile memory cells will fail.

In one example implementation, the operational data includes information other than a binary indicator of whether any particular leak test failed.

In one example implementation, the control circuit includes a charge pump configured to generate a voltage for one or more of the leak tests; the control circuit comprises a current mirror in communication with the charge pump; and the operational data comprises measurements of current from the current mirror.

In one example implementation, the control circuit includes a charge pump configured to generate a test voltage for one or more of the leak tests; the control circuit comprises a counter to count clock cycles needed to drive the test voltage; and the operational data comprises a number of clock cycles needed to drive the test voltage.

In one example implementation, the erase process and the leak tests are performed during a garbage collection process while the non-volatile storage apparatus is otherwise idle.

In one example implementation, the model is a pre-trained model received pre-trained from a source external to the non-volatile storage apparatus; the first set of non-volatile memory cells comprise a block of non-volatile memory cells arranged in NAND strings; the signal lines comprise data word lines connected to the block, source side select lines connected to the block, and drain side select lines connected to the block; the non-volatile memory structure further comprises additional non-volatile memory cells storing the pre-trained model; and the control circuit is configured to perform multiple leak tests for the signal lines by: performing leak tests for the data word lines by applying high voltages to some of the word lines and low voltages to other of the word lines and sensing a first set of one or more measurements indicative of current flowing, perform leak tests for the source side select lines by applying high voltages to source side select lines and low voltages to data word lines and sensing a second set of one or more measurements indicative of current flowing, and perform leak tests for the drain side select lines by applying high voltages to drain side select lines and low voltages to data word lines and sensing a third set of one or more measurements indicative of current flowing; the inference circuit is configured to use the pre-trained model with the first set of one or more measurements indicative of current flowing, the second set of one or more measurements indicative of current flowing, and the third set of one or more measurements indicative of current flowing to predict whether the block will fail; and the control circuit is further configured to: perform an erase process on the block while the inference is working to predict whether the block will fail; add the block to a bad block pool in response to the inference predicting that the block will fail or the erase process failing, and use the block to store new data in response to the inference predicting that the block will not fail or the erase process succeeding.

One embodiment includes a method, comprising: performing multiple different leak tests for a set of signal lines connected to a first set of non-volatile memory cells, including measuring operational data during each of the leak tests; using an inference engine with a pre-trained model and the operational data measured during each of the leak tests to predict whether the first set of non-volatile memory cells will fail; while using the inference engine to predict whether the first set of non-volatile memory cells will fail, performing an erase process including applying one or more erase voltage pulses to the first set of non-volatile memory cells and performing erase verify after at least a subset of the erase voltage pulses until the erase process is determined to have passed or failed; allowing the first set of non-volatile memory cells to store valid user data in response to determining that the erase process passed and the inference engine predicting that the first set of non-volatile memory cells will not fail; and preventing the first set of non-volatile memory cells from storing valid user data in response to determining that the erase process failed or the inference engine predicting that the first set of non-volatile memory cells will fail. In one example implementation, the operational data includes information other than a binary indicator of whether any particular leak test failed.

One embodiment includes a non-volatile storage apparatus, comprising a memory die assembly. The memory die assembly comprising: a non-volatile memory structure and a control circuit connected to the non-volatile memory structure. The non-volatile memory structure comprising a block of non-volatile memory cells arranged in NAND strings, data word lines connected to the block, source side select lines connected to the block, drain side select lines connected to the block and additional non-volatile memory cells storing a pre-trained model received pre-trained from a source external to the non-volatile storage apparatus. The control circuit is to program and erase the block of non-volatile memory cells, the control circuit comprises an inference circuit positioned in the memory die assembly. The control circuit is configured to: perform leak tests for the data word lines by applying high voltages to some of the word lines and low voltages to other of the word lines and sensing a first set of one or more measurements indicative of current flowing, perform leak tests for the source side select lines by applying high voltages to source side select lines and low voltages to data word lines and sensing a second set of one or more measurements indicative of current flowing, perform leak tests for the drain side select lines by applying high voltages to drain side select lines and low voltages to data word lines and sensing a third set of one or more measurements indicative of current flowing, use the inference circuit with pre-trained model, the first set of one or more measurements indicative of current flowing, the second set of one or more measurements indicative of current flowing, and the third set of one or more measurements indicative of current flowing to predict whether the block will fail; perform an erase process on the block while using the inference circuit to predict whether the block will fail; add the block to a bad block pool in response to the inference circuit predicting that the block will fail or the erase process failing, and use the block to store new data in response to the inference circuit predicting that the block will not fail or the erase process succeeding.

In one example implementation, the memory die assembly comprises a memory die and the non-volatile memory structure and the inference circuit are both positioned on the memory die.

In one example implementation, the memory die assembly comprises a memory die bonded to control die; the non-volatile memory is positioned on the memory die; and the inference circuit is positioned on the control die.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile storage apparatus, comprising:
a non-volatile memory structure comprising a first set of non-volatile memory cells and signal lines connected to the first set of non-volatile memory cells; and
a control circuit connected to the non-volatile memory structure and configured to program and erase the first set of non-volatile memory cells, the control circuit comprises an inference circuit, the control circuit is configured to perform multiple leak tests for the signal lines, the multiple leak tests are integrated into a pre-erase process for the first set of non-volatile memory cells after the first set of non-volatile memory cells have received programming, the inference circuit is configured to use results of the leak tests with a model to predict whether the first set of non-volatile memory cells will fail, the control circuit is further configured to perform an erase process for the first set of non-volatile memory cells including applying one or more erase voltage pulses to the first set of non-volatile memory cells while using the inference circuit to predict whether the first set of non-volatile memory cells will fail.

2. The non-volatile storage apparatus of claim 1, wherein:
the control circuit is further configured to perform a countermeasure to prevent loss of data prior to a failure in the first set of non-volatile memory cells if the inference circuit predicts that the first set of non-volatile memory cells will fail.

3. The non-volatile storage apparatus of claim 1, wherein:
the control circuit is further configured to prevent the first set of non-volatile memory cells from further storage of valid data if the inference circuit predicts that the first set of non-volatile memory cells will fail.

4. The non-volatile storage apparatus of claim 1, wherein:
the model is a pre-trained model received pre-trained from a source external to the non-volatile storage apparatus; and
the model is stored in the non-volatile memory structure.

5. The non-volatile storage apparatus of claim 1, wherein:
the control circuit is configured to perform an erase process on the first set of non-volatile memory cells while the inference circuit uses results of the leak tests with the model to predict whether the first set of non-volatile memory cells will fail.

6. The non-volatile storage apparatus of claim 5, wherein:
the control circuit is further configured to prevent the first set of non-volatile memory cells from further storage of valid data if the inference circuit predicts that the first set of non-volatile memory cells will fail or the erase process fails.

7. The non-volatile storage apparatus of claim 6, wherein:
the control circuit is further configured to allow the first set of non-volatile memory cells to store future valid data if the inference circuit predicts that the first set of non-volatile memory cells will not fail and the erase process succeeds.

8. The non-volatile storage apparatus of claim 1, wherein:
the control circuit is configured to independently enable and disable any of the multiple leak tests; and
the inference circuit is configured to use results of whichever leak tests are enabled to predict whether the first set of non-volatile memory cells will fail.

9. The non-volatile storage apparatus of claim 1, wherein:
the control circuit is configured to perform multiple erase processes on the first set of non-volatile memory cells; and
the control circuit is configured to perform the multiple leak tests before only a subset of the erase processes.

10. The non-volatile storage apparatus of claim 1, wherein:
the results of the leaks tests include operational data measured during each of the leak tests;
the inference circuit is configured to use the operational data to predict whether the first set of non-volatile memory cells will fail; and
the control circuit is further configured to:
allow the first set of non-volatile memory cells to store valid user data in response to determining that the erase process passed and the inference circuit predicting that the first set of non-volatile memory cells will not fail, and
prevent the first set of non-volatile memory cells from storing valid user data in response to determining that the erase process failed or the inference circuit predicting that the first set of non-volatile memory cells will fail.

11. The non-volatile storage apparatus of claim 10, wherein:
the operational data includes information other than a binary indicator of whether any particular leak test failed.

12. The non-volatile storage apparatus of claim 10, wherein:
the control circuit includes a charge pump configured to generate a voltage for one or more of the leak tests;
the control circuit comprises a current mirror in communication with the charge pump; and
the operational data comprises measurements of current from the current mirror.

13. The method of claim 10, wherein:
the control circuit includes a charge pump configured to generate a test voltage for one or more of the leak tests;
the control circuit comprises a counter to count clock cycles needed to drive the test voltage; and
the operational data comprises a number of clock cycles needed to drive the test voltage.

14. The method of claim 10, wherein:
the erase process and the leak tests are performed during a garbage collection process while the non-volatile storage apparatus is otherwise idle.

15. The non-volatile storage apparatus of claim 1, wherein:
the model is a pre-trained model received pre-trained from a source external to the non-volatile storage apparatus;
the first set of non-volatile memory cells comprise a block of non-volatile memory cells arranged in NAND strings;
the signal lines comprise data word lines connected to the block, source side select lines connected to the block, and drain side select lines connected to the block;
the non-volatile memory structure further comprises additional non-volatile memory cells storing the pre-trained model; and
the control circuit is configured to perform multiple leak tests for the signal lines by:
performing leak tests for the data word lines by applying high voltages to some of the word lines and low voltages to other of the word lines and sensing a first set of one or more measurements indicative of current flowing,
perform leak tests for the source side select lines by applying high voltages to source side select lines and low voltages to data word lines and sensing a second set of one or more measurements indicative of current flowing, and
perform leak tests for the drain side select lines by applying high voltages to drain side select lines and low voltages to data word lines and sensing a third set of one or more measurements indicative of current flowing;
the inference circuit is configured to use the pre-trained model with the first set of one or more measurements indicative of current flowing, the second set of one or more measurements indicative of current flowing, and the third set of one or more measurements indicative of current flowing to predict whether the block will fail; and
the control circuit is further configured to:
perform an erase process on the block while the inference is working to predict whether the block will fail,
add the block to a bad block pool in response to the inference predicting that the block will fail or the erase process failing, and
use the block to store new data in response to the inference predicting that the block will not fail or the erase process succeeding.

16. A method, comprising:

performing multiple different leak tests for a set of signal lines connected to a first set of non-volatile memory cells, including measuring operational data during each of the leak tests;

using an inference engine with a pre-trained model and the operational data measured during each of the leak tests to predict whether the first set of non-volatile memory cells will fail;

while using the inference engine to predict whether the first set of non-volatile memory cells will fail, performing an erase process including applying one or more erase voltage pulses to the first set of non-volatile memory cells and performing erase verify after at least a subset of the erase voltage pulses until the erase process is determined to have passed or failed;

allowing the first set of non-volatile memory cells to store valid user data in response to determining that the erase process passed and the inference engine predicting that the first set of non-volatile memory cells will not fail; and preventing the first set of non-volatile memory cells from storing valid user data in response to determining that the erase process failed or the inference engine predicting that the first set of non-volatile memory cells will fail.

17. The method of claim 16, wherein:

the operational data includes information other than a binary indicator of whether any particular leak test failed.

18. A non-volatile storage apparatus, comprising:

a memory die assembly comprising:

a non-volatile memory structure comprising a block of non-volatile memory cells arranged in NAND strings, data word lines connected to the block, source side select lines connected to the block, drain side select lines connected to the block and additional non-volatile memory cells storing a pre-trained model received pre-trained from a source external to the non-volatile storage apparatus; and control circuit connected to the non-volatile memory structure and configured to program and erase the block of non-volatile memory cells, the control circuit comprises an inference circuit positioned in the memory die assembly, the control circuit is configured to:

perform leak tests for the data word lines by applying high voltages to some of the word lines and low voltages to other of the word lines and sensing a first set of one or more measurements indicative of current flowing, perform leak tests for the source side select lines by applying high voltages to source side select lines and low voltages to data word lines and sensing a second set of one or more measurements indicative of current flowing, perform leak tests for the drain side select lines by applying high voltages to drain side select lines and low voltages to data word lines and sensing a third set of one or more measurements indicative of current flowing, use the inference circuit with pre-trained model, the first set of one or more measurements indicative of current flowing, the second set of one or more measurements indicative of current flowing, and the third set of one or more measurements indicative of current flowing to predict whether the block will fail, perform an erase process on the block while using the inference circuit to predict whether the block will fail, add the block to a bad block pool in response to the inference circuit predicting that the block will fail or the erase process failing, and use the block to store new data in response to the inference circuit predicting that the block will not fail or the erase process succeeding.

19. The non-volatile storage apparatus of claim 18, wherein:

the memory die assembly comprises a memory die; and the non-volatile memory structure and the inference circuit are both positioned on the memory die.

20. The non-volatile storage apparatus of claim 18, wherein:

the memory die assembly comprises a memory die bonded to control die;

the non-volatile memory is positioned on the memory die; and the inference circuit is positioned on the control die.

\* \* \* \* \*